(12) United States Patent
Purayath et al.

(10) Patent No.: US 8,823,075 B2
(45) Date of Patent: Sep. 2, 2014

(54) SELECT GATE FORMATION FOR NANODOT FLAT CELL

(71) Applicant: SanDisk Technologies, Inc., Plano, TX (US)

(72) Inventors: Vinod Purayath, Santa Clara, CA (US); James Kai, Santa Clara, CA (US); Yuan Zhang, San Jose, CA (US); Donovan Lee, Santa Clara, CA (US); George Matamis, Danville, CA (US)

(73) Assignee: SanDisk Technologies Inc., Plano, TX (US)

( * ) Notice: Subject to any disclaimer, the term of this patent is extended or adjusted under 35 U.S.C. 154(b) by 58 days.

(21) Appl. No.: 13/690,054

(22) Filed: Nov. 30, 2012

(65) Prior Publication Data
US 2014/0151778 A1 Jun. 5, 2014

(51) Int. Cl.
H01L 29/788 (2006.01)
H01L 27/088 (2006.01)
H01L 21/762 (2006.01)

(52) U.S. Cl.
CPC ............ H01L 27/088 (2013.01); H01L 21/76224 (2013.01)
USPC .................. 257/321; 257/E29.3

(58) Field of Classification Search
USPC .......................................... 257/321
See application file for complete search history.

(56) References Cited

U.S. PATENT DOCUMENTS

| 5,570,315 | A | 10/1996 | Tanaka et al. |
| 5,714,766 | A | 2/1998 | Chen et al. |
| 5,774,397 | A | 6/1998 | Endoh et al. |
| 6,015,738 | A | 1/2000 | Levy et al. |
| 6,046,935 | A | 4/2000 | Takeuchi et al. |
| 6,208,000 | B1 | 3/2001 | Tanamoto et al. |
| 6,297,095 | B1 | 10/2001 | Muralidhar et al. |
| 6,407,424 | B2 | 6/2002 | Forbes |
| 6,646,302 | B2 | 11/2003 | Kan et al. |
| 6,656,792 | B2 | 12/2003 | Choi et al. |
| 6,859,397 | B2 | 2/2005 | Lutze et al. |
| 6,881,994 | B2 | 4/2005 | Lee et al. |
| 6,913,984 | B2 | 7/2005 | Kim et al. |
| 6,917,542 | B2 | 7/2005 | Chen et al. |

(Continued)

FOREIGN PATENT DOCUMENTS

DE   10 2008 009365 A1   10/2008

OTHER PUBLICATIONS

Haryono et al., "Controlled Arrangement of Nanoparticle Arrays in Block-Copolymer Domains," Small 2.5 (2006): 600-611.

(Continued)

Primary Examiner — Lex Malsawma
(74) Attorney, Agent, or Firm — The Marbury Law Group PLLC

(57) ABSTRACT

Methods of fabricating a memory device include forming a tunnel oxide layer over a memory cell area of a semiconductor substrate, forming a floating gate layer over the tunnel oxide layer in the memory cell area, the floating gate layer comprising a plurality of nanodots embedded in a dielectric material, forming a blocking dielectric layer over the floating gate layer in the memory cell area, removing portions of the blocking dielectric layer, the floating gate layer, the tunnel oxide layer, and the semiconductor substrate in the memory cell area to form a first plurality of isolation trenches, and forming isolation material within the first plurality of isolation trenches.

7 Claims, 21 Drawing Sheets

(56) References Cited

U.S. PATENT DOCUMENTS

| | | |
|---|---|---|
| 6,927,136 B2 | 8/2005 | Lung et al. |
| 6,991,984 B2 | 1/2006 | Ingersoll et al. |
| 7,045,851 B2 | 5/2006 | Black et al. |
| 7,119,395 B2 | 10/2006 | Gutsche et al. |
| 7,138,680 B2 | 11/2006 | Li et al. |
| 7,173,304 B2 | 2/2007 | Weimer et al. |
| 7,259,984 B2 | 8/2007 | Kan et al. |
| 7,649,779 B2 * | 1/2010 | Ruttkowski et al. ..... 365/185.18 |
| 7,723,186 B2 | 5/2010 | Purayath et al. |
| 8,193,055 B1 | 6/2012 | Purayath et al. |
| 2004/0026682 A1 | 2/2004 | Jiang |
| 2004/0094794 A1 | 5/2004 | Wu |
| 2004/0130941 A1 | 7/2004 | Kan et al. |
| 2004/0180491 A1 | 9/2004 | Arai et al. |
| 2004/0256662 A1 | 12/2004 | Black et al. |
| 2005/0112820 A1 | 5/2005 | Chen et al. |
| 2005/0122775 A1 | 6/2005 | Koyanagi et al. |
| 2005/0258470 A1 | 11/2005 | Lojek et al. |
| 2005/0287717 A1 | 12/2005 | Heald et al. |
| 2006/0250836 A1 | 11/2006 | Herner et al. |
| 2006/0250837 A1 | 11/2006 | Herner et al. |
| 2007/0045604 A1 | 3/2007 | Liu et al. |
| 2007/0158736 A1 * | 7/2007 | Arai et al. ..................... 257/315 |
| 2008/0026532 A1 | 1/2008 | Duan et al. |
| 2008/0237692 A1 | 10/2008 | Lee et al. |
| 2008/0242011 A1 * | 10/2008 | Song et al. ..................... 438/151 |
| 2009/0001345 A1 | 1/2009 | Schricker et al. |
| 2009/0014704 A1 | 1/2009 | Chen et al. |
| 2009/0027944 A1 | 1/2009 | Ufert |
| 2009/0097320 A1 * | 4/2009 | Min et al. ................. 365/185.18 |
| 2009/0117697 A1 | 5/2009 | Park et al. |
| 2009/0134444 A1 | 5/2009 | Hanafi |
| 2009/0146140 A1 | 6/2009 | Kim et al. |
| 2009/0155967 A1 | 6/2009 | Purayath et al. |
| 2009/0168491 A1 | 7/2009 | Schricker et al. |
| 2010/0008128 A1 | 1/2010 | Yoshii et al. |
| 2011/0020992 A1 | 1/2011 | Purayath et al. |
| 2011/0147337 A1 | 6/2011 | Lee |
| 2011/0186799 A1 | 8/2011 | Kai et al. |
| 2013/0105881 A1 | 5/2013 | Kai et al. |

OTHER PUBLICATIONS

Chan et al., "A True Single-Transistor Oxide-Nitride-Oxide EEPROM Device," IEEE Electron Device Letters, vol. EDL-8, No. 3, Mar. 1987, pp. 93-95.

Nozaki et al., "A 1-Mb EEPROM with MONOS Memory Cell for Semiconductor Disk Application," EEE Journal of Solid-State Circuits, vol. 26, No. 4, Apr. 1991, pp. 497-501.

Komatsu et al., "Applying Nanotechnology to Electronics," Science & Technology Trends, Quarterly Review No. 16, Jul. 2005, pp. 36-45.

Guarini et al., "Low Voltage, Scalable Nanocrystal Flash Memory Fabricated by Templated Self-Assembly," IEEE Int. Electron Devices Meeting Tech. Diges, vol. 22, No. 2, Dec. 2003, pp. 1-4.

U.S. Appl. No. 61/667,007, V. Purayath et al., "NAND Memory Device Containing Nanodots," filed Jul. 2, 2012.

U.S. Appl. No. 13/708,587, V. Purayath et al., "NAND Memory Device Containing Nanodots and Method of Making Thereof," Specification and drawings, filed Dec. 7, 2012.

U.S. Appl. No. 13/708,677, V. Purayath et al., "Non-Volatile Memory Structure Containing Nanodots and Continuous Metal Layer Charge Traps and Method of Making Thereof," Specification and drawings, filed Dec. 7, 2012.

Partial International Search Report, International Application No. PCT/US2011/023617, May 24, 2011.

International Preliminary Report on Patentability, International Application No. PCT/US2011/023617, Aug. 16, 2012.

International Search Report & Written Opinion, International Application No. PCT/US2011/023617, Jul. 13, 2011.

International Search Report and Written Opinion received in connection with International Application No. PCT/US2013/070316, mailed Apr. 22, 2014.

Invitation to Pay additional Fees with Annexed Partial Search Report received in connection with International Application No. PCT/US2013/070316, mailed Feb. 27, 2014.

* cited by examiner

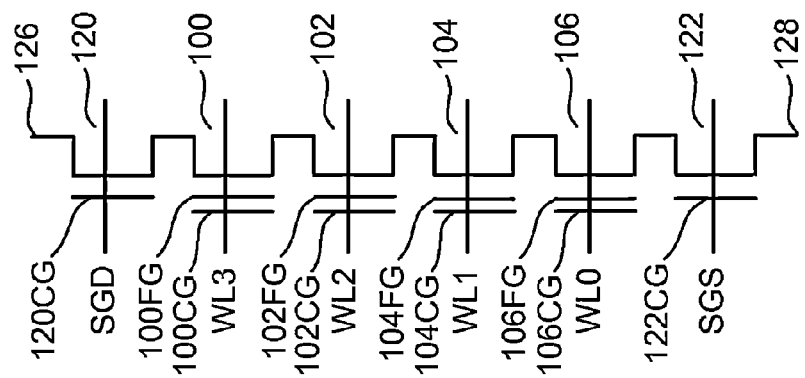
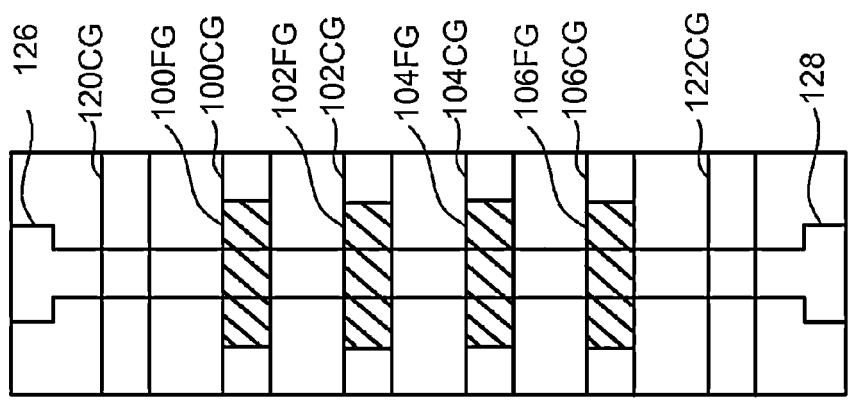

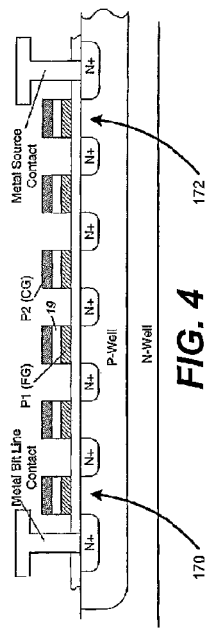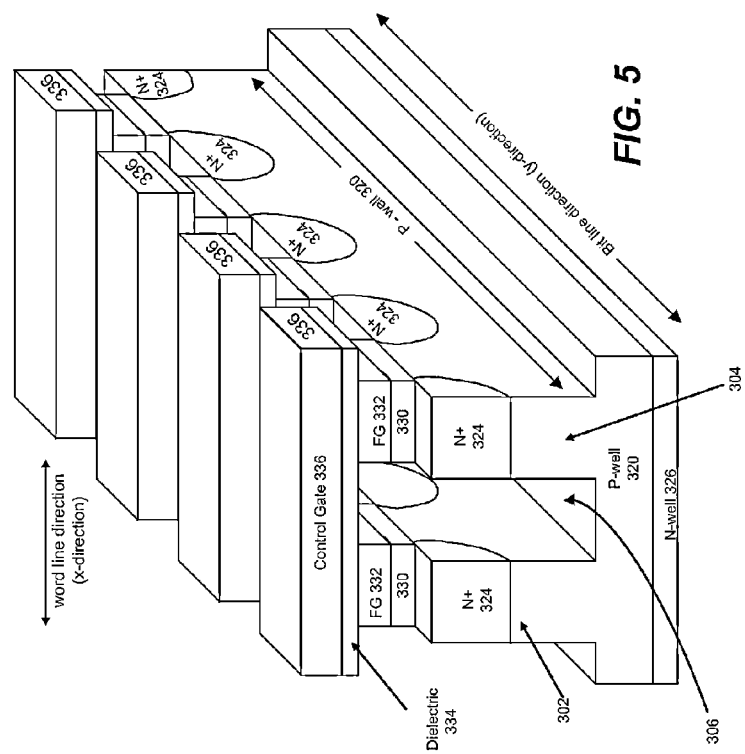

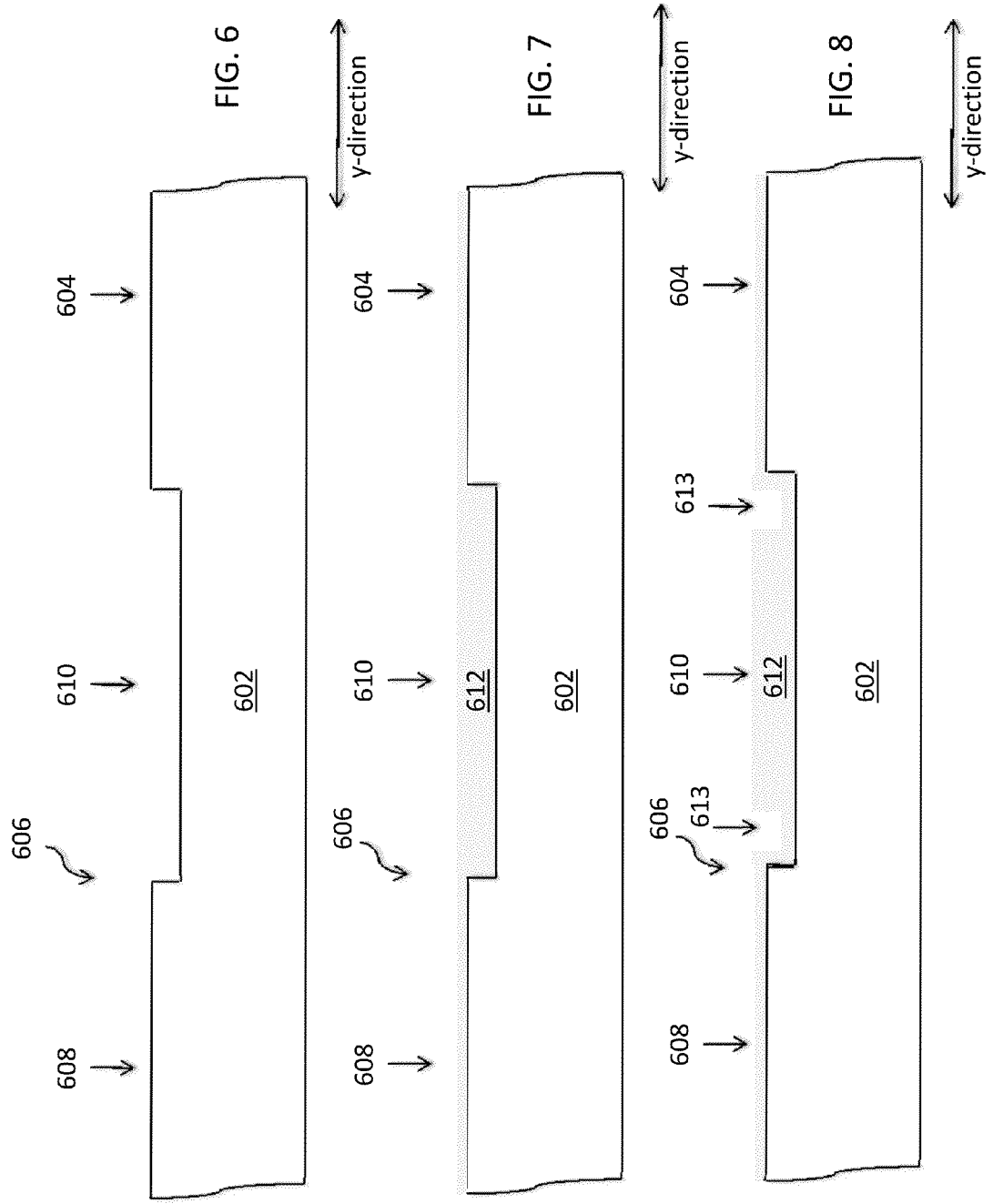

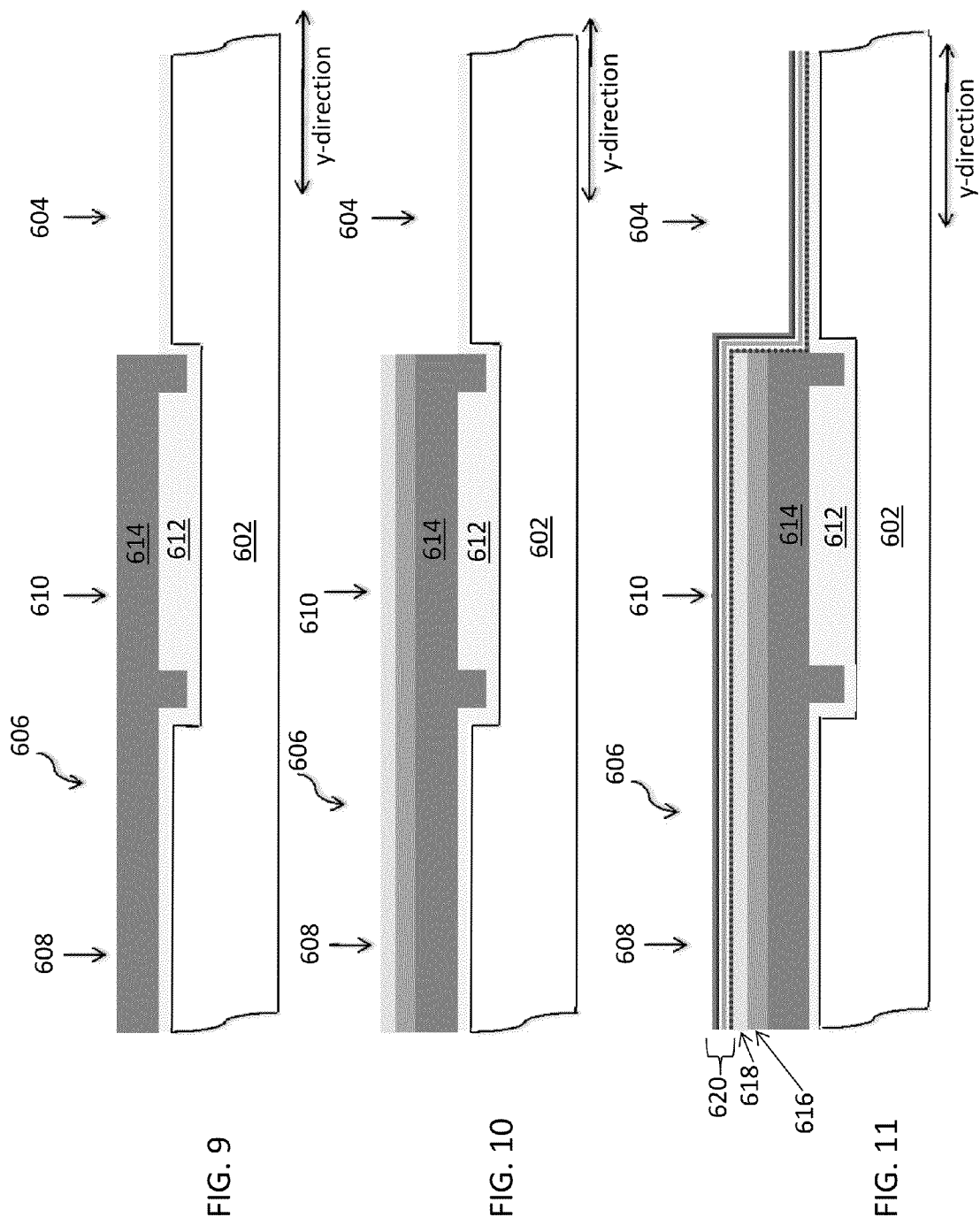

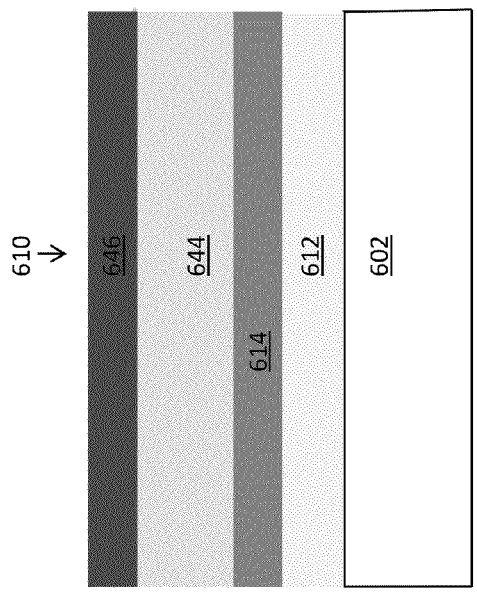
FIG. 16C
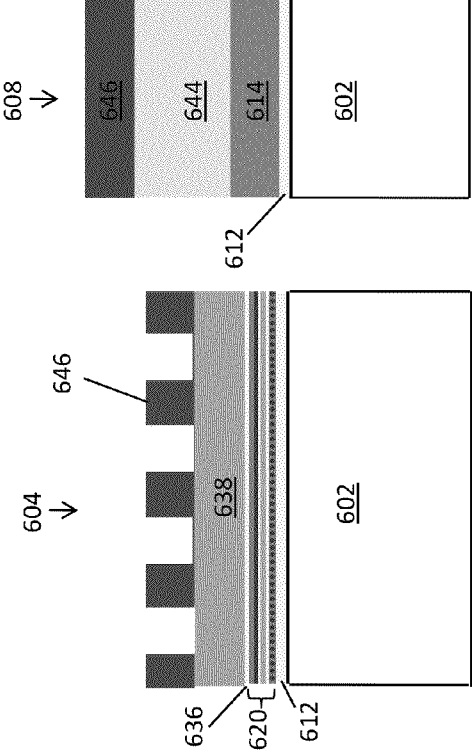
FIG. 16B
FIG. 16A
FIG. 17C
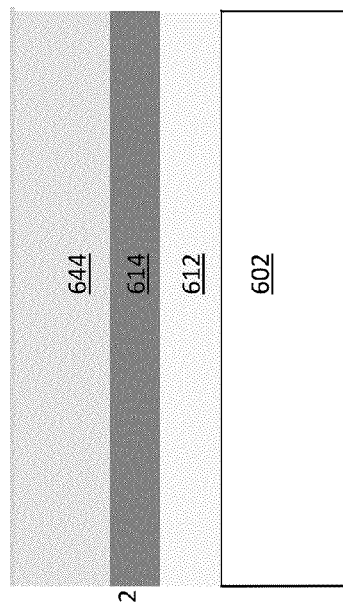
FIG. 17B
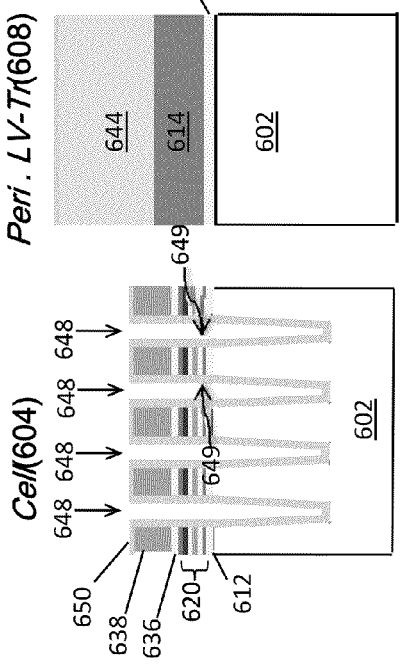
FIG. 17A

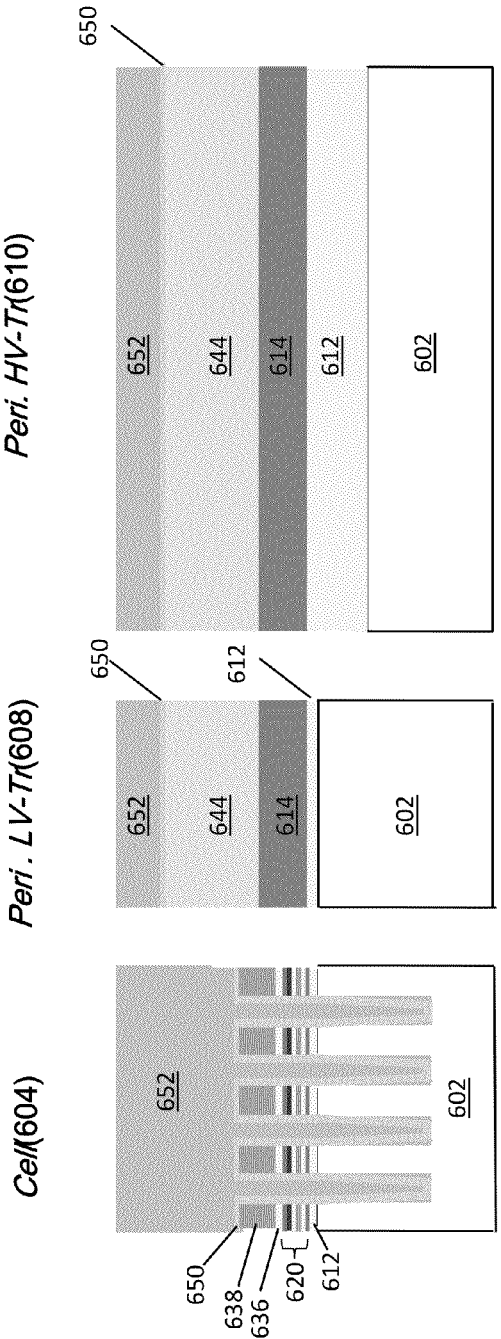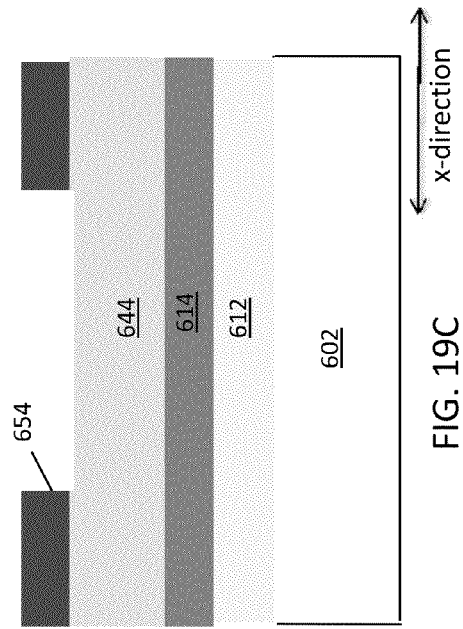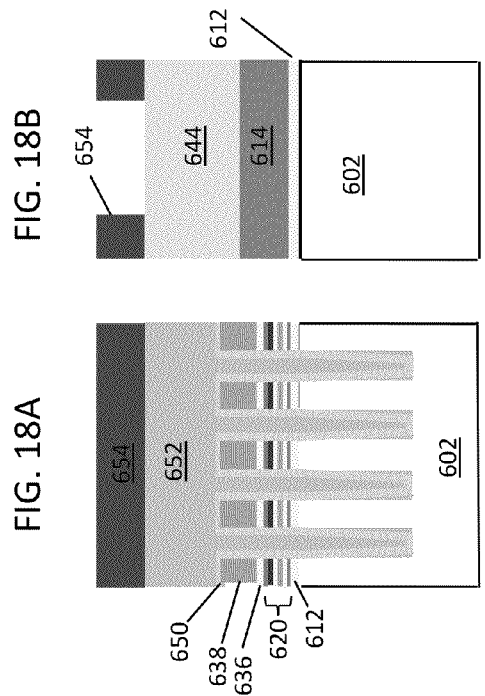

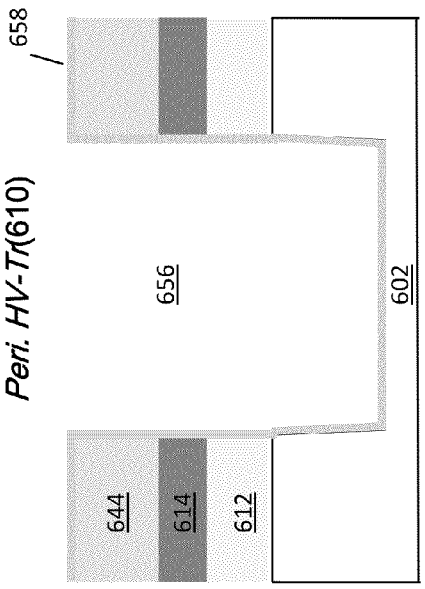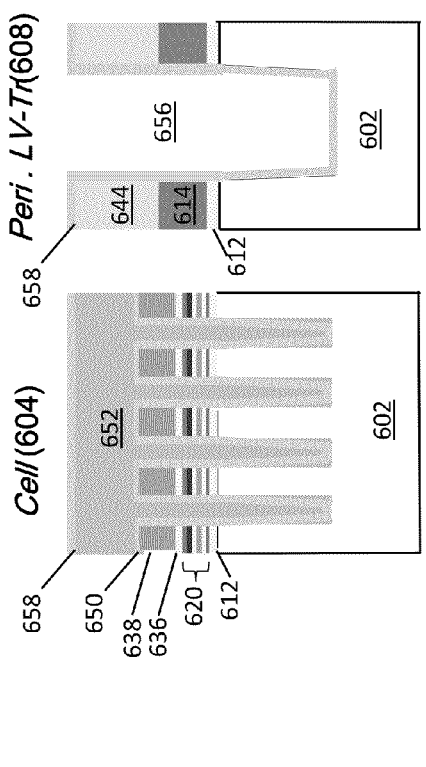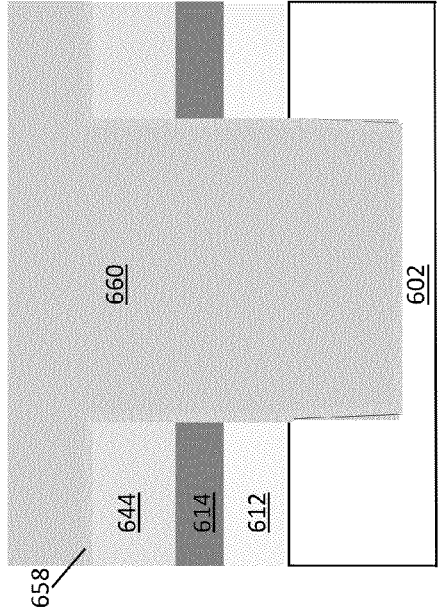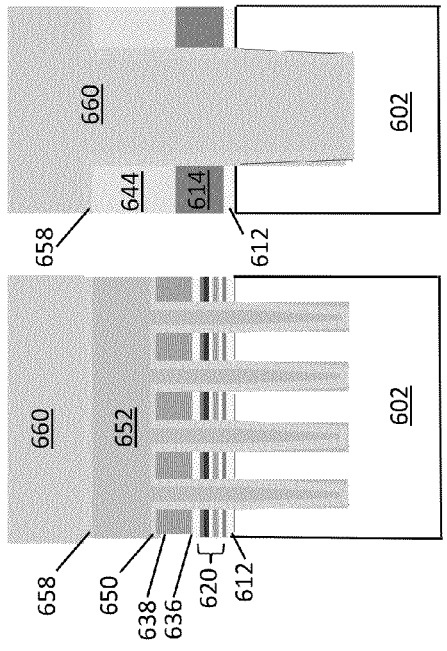

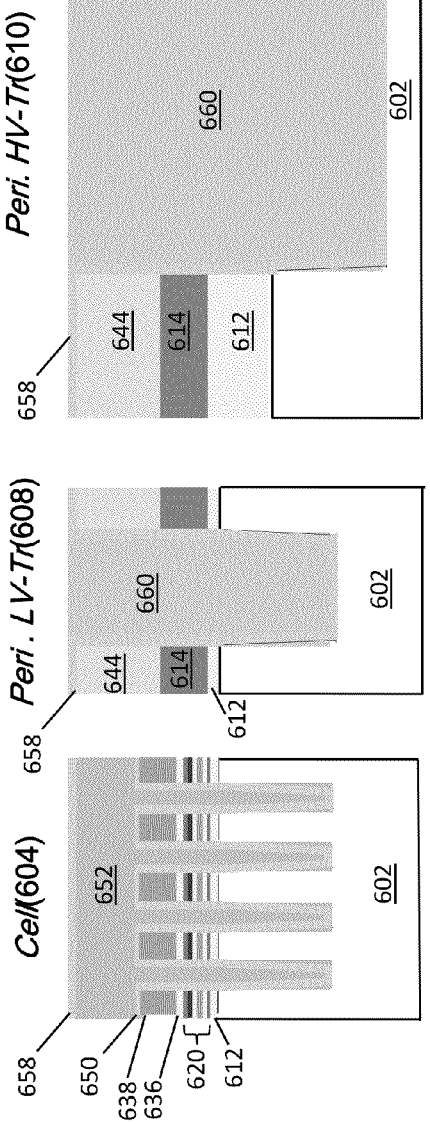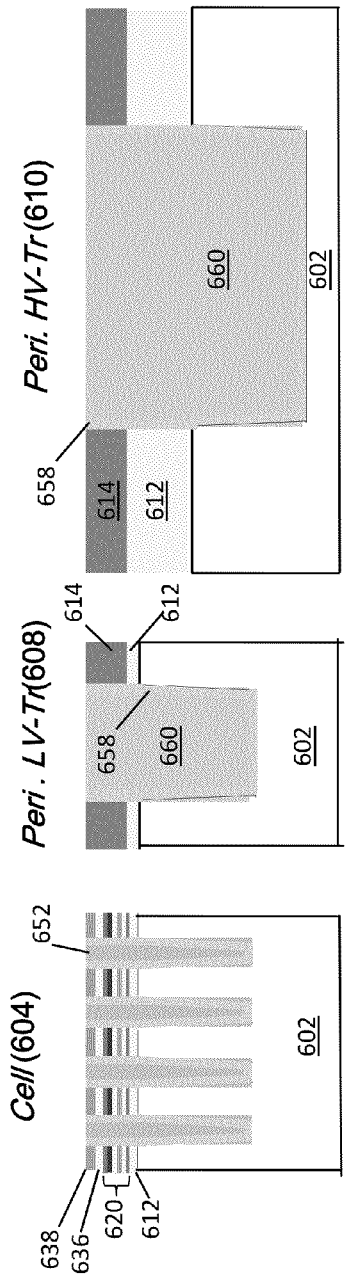

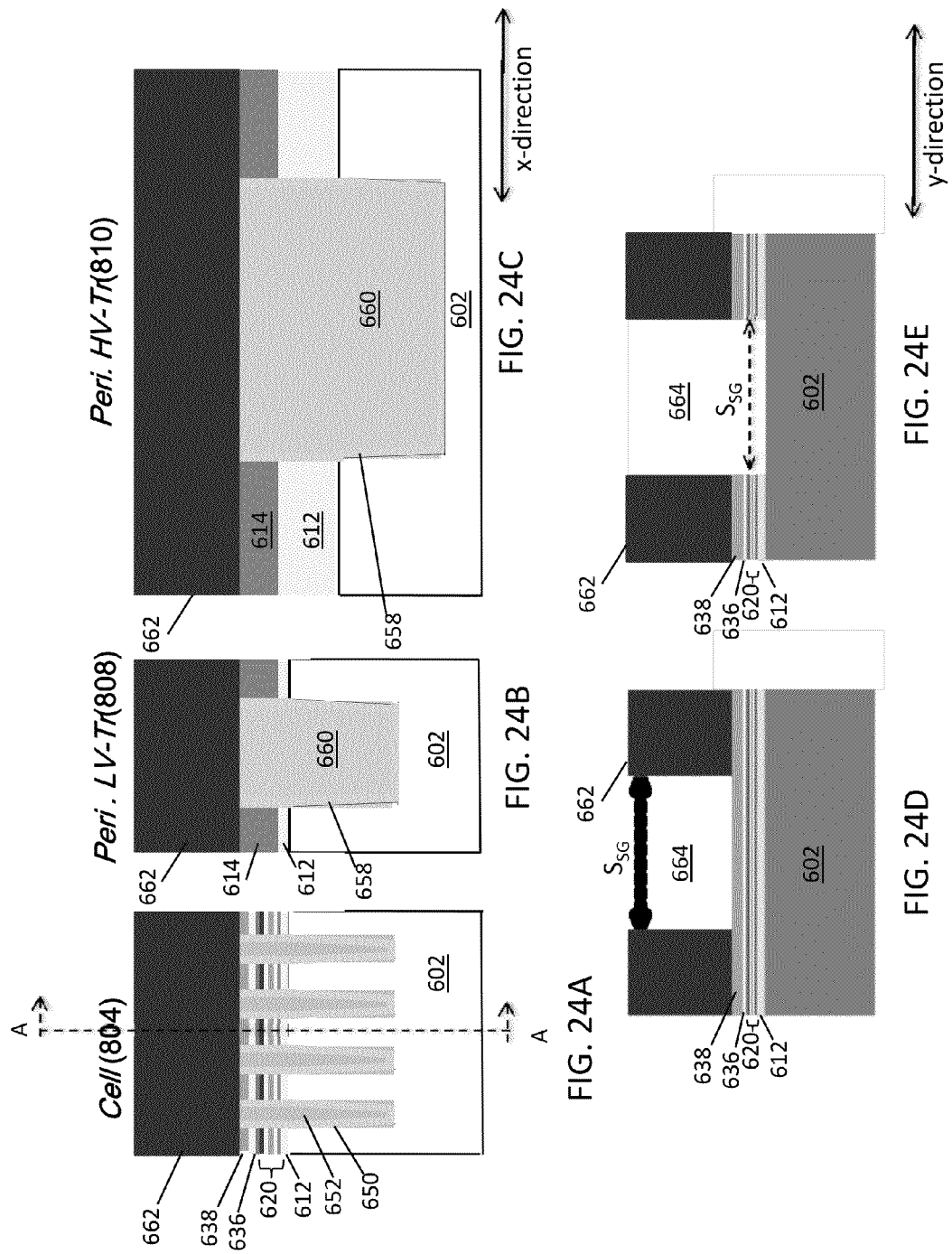

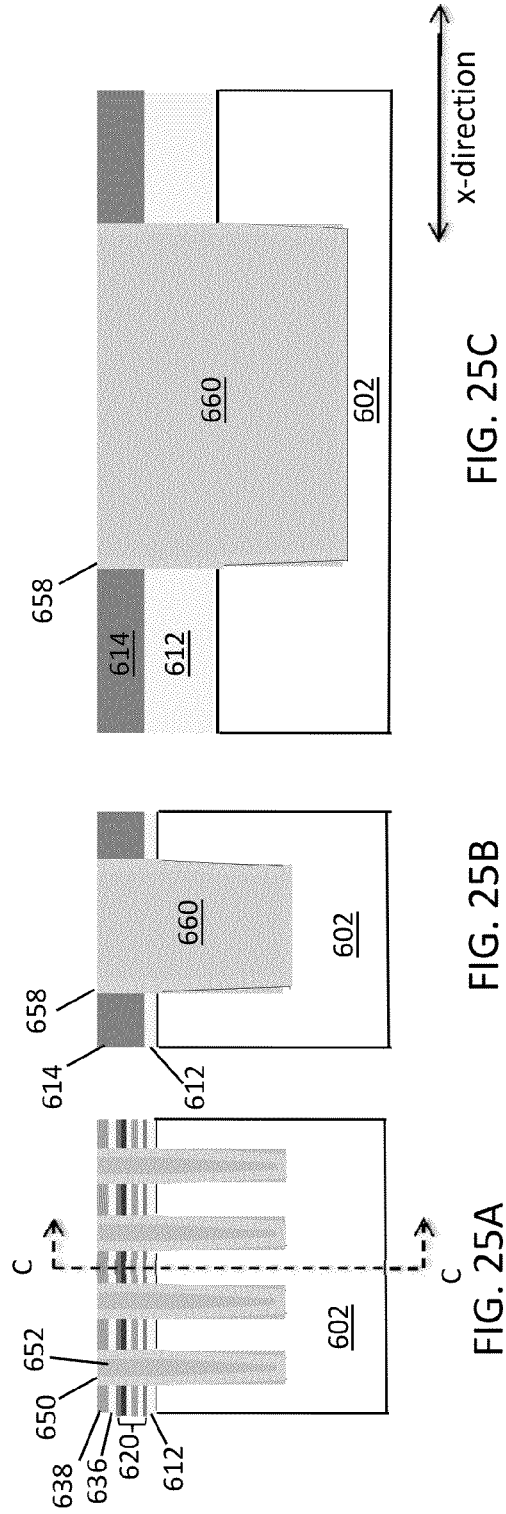
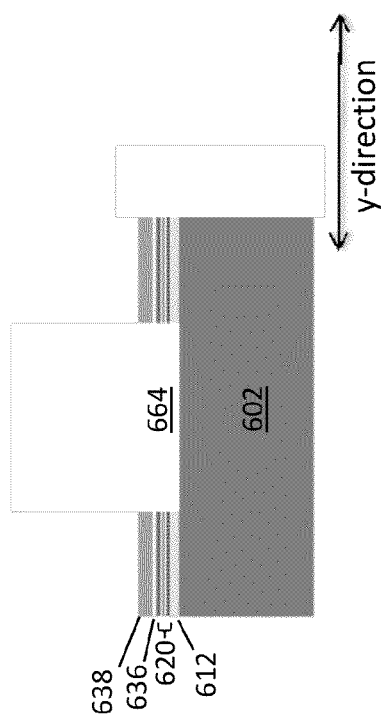
FIG. 25C
FIG. 25B
FIG. 25A
FIG. 25D

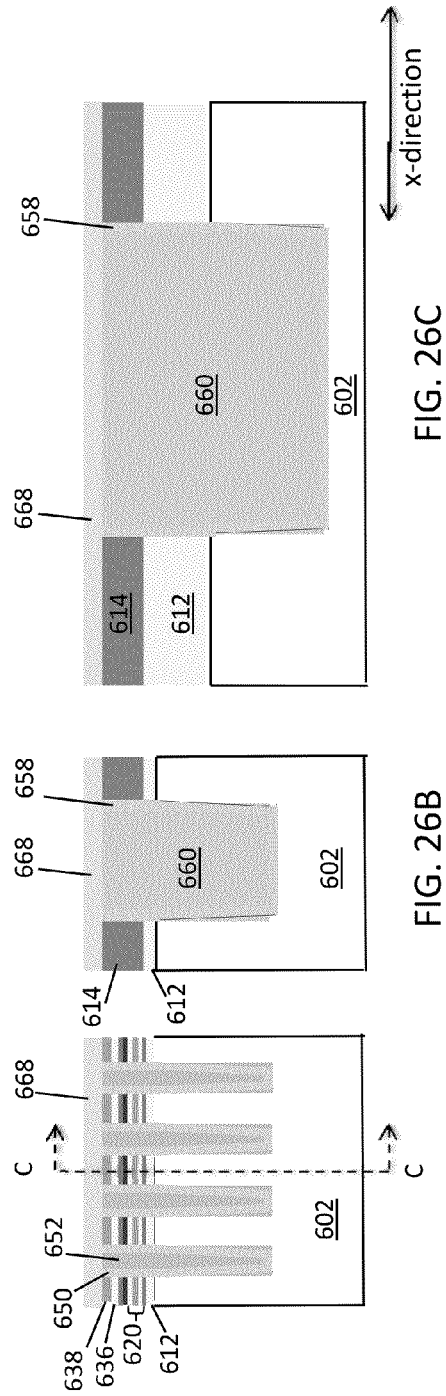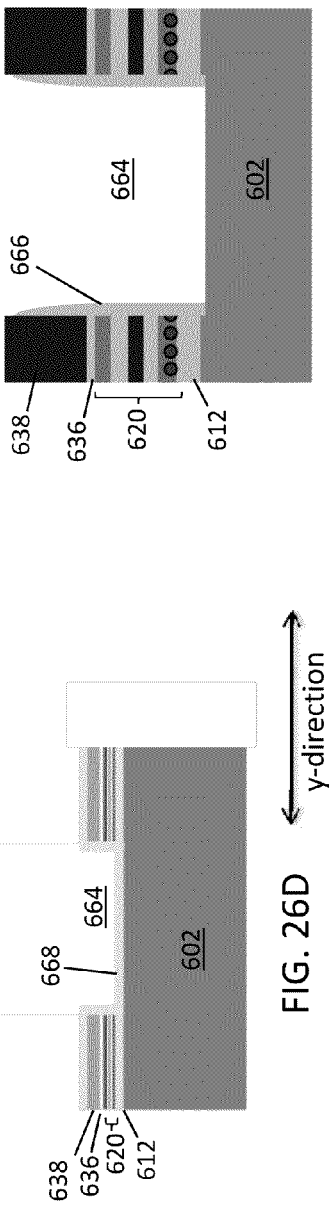

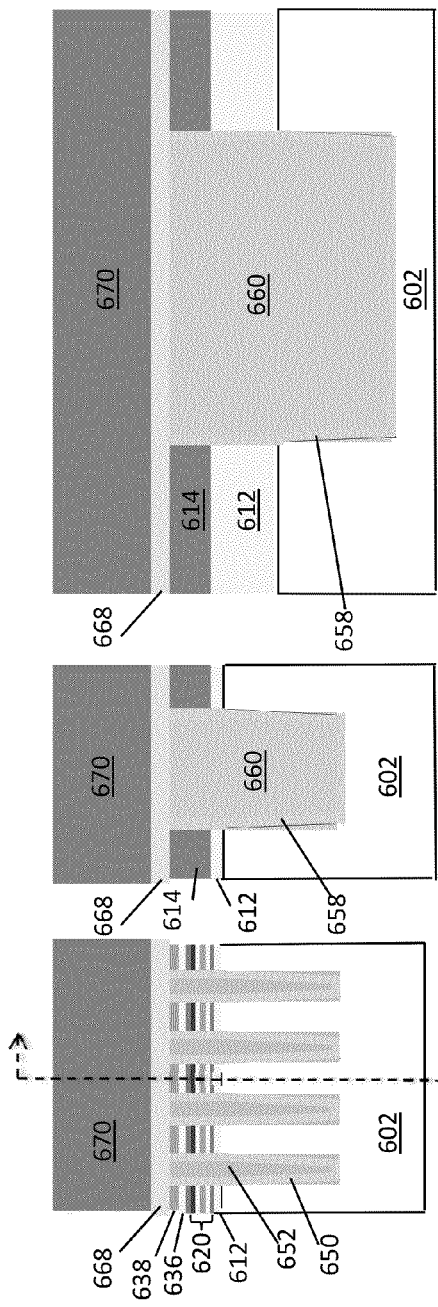
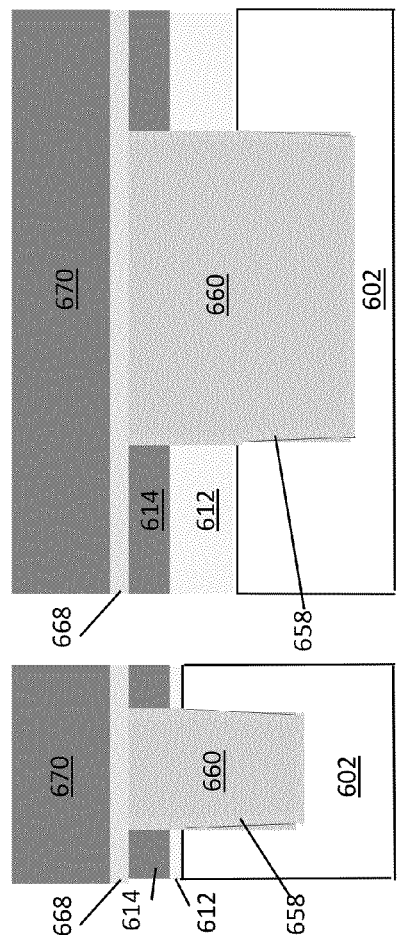
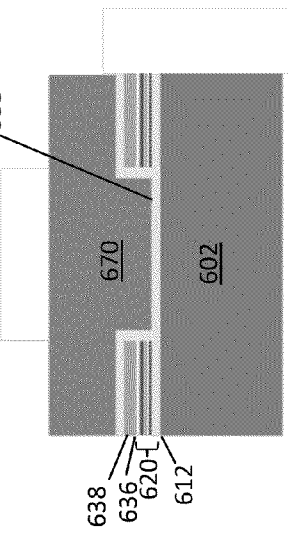
FIG. 28A
FIG. 28B
FIG. 28C
FIG. 28D

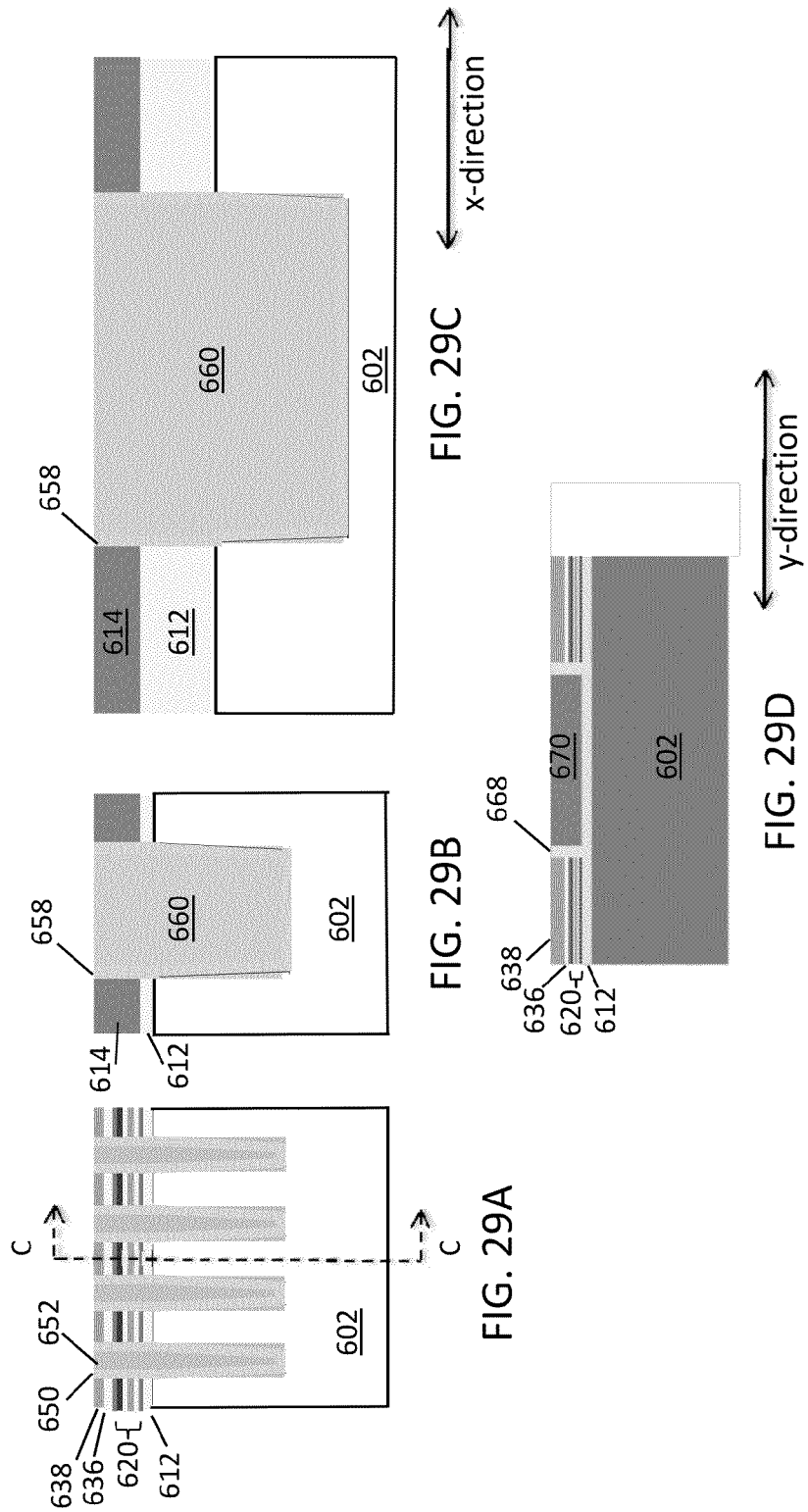

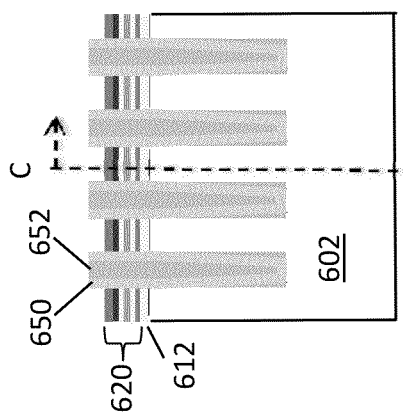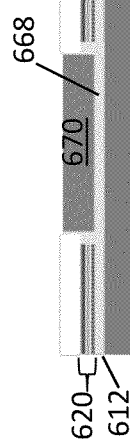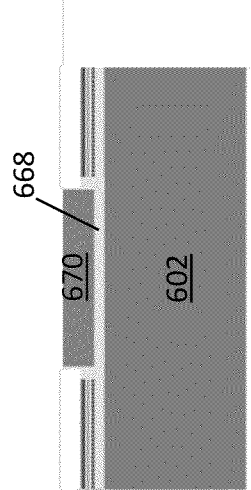
FIG. 30A
FIG. 30B
FIG. 30C
FIG. 30D

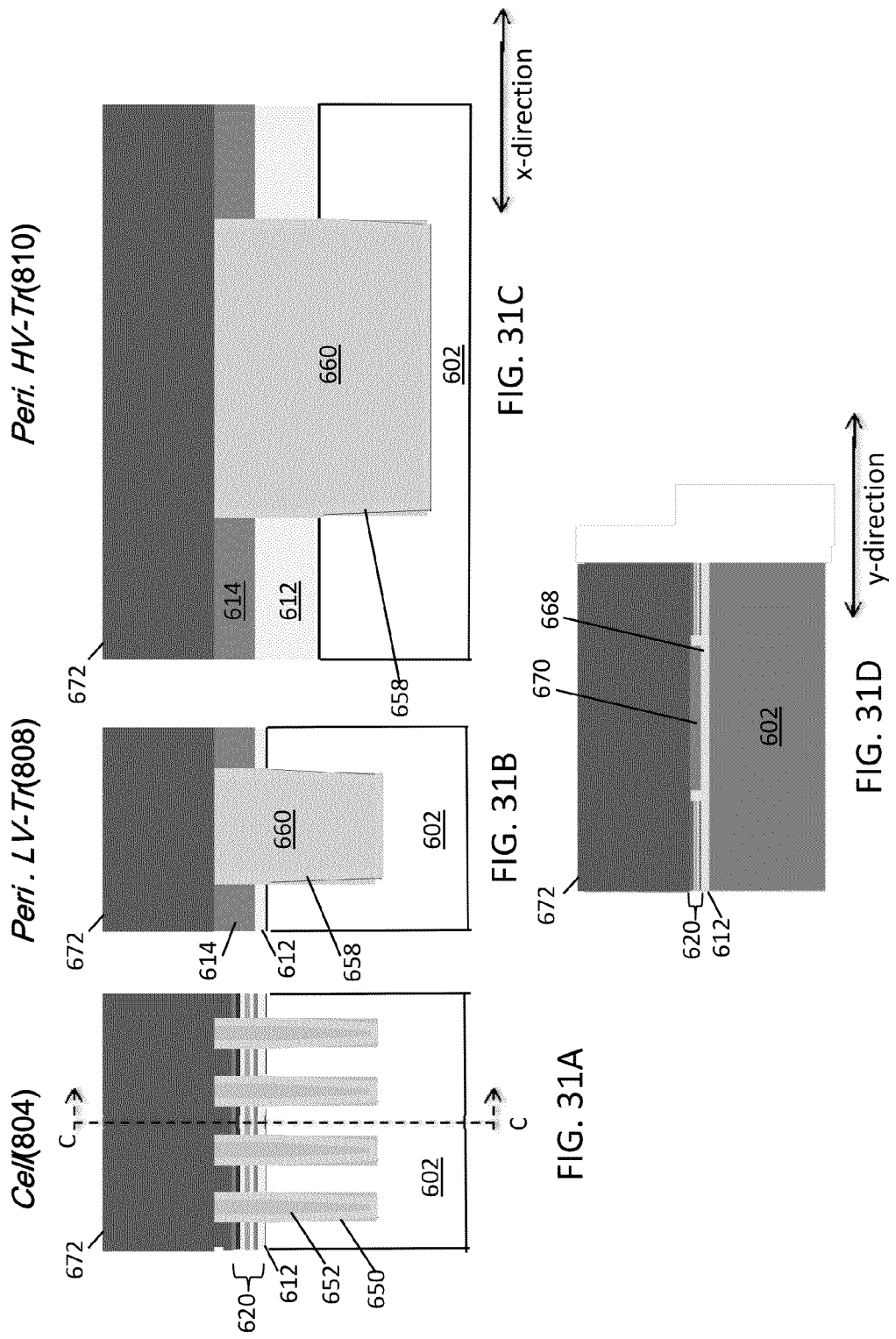

SELECT GATE FORMATION FOR NANODOT FLAT CELL

FIELD OF THE INVENTION

The present invention relates to memory devices and methods of fabricating memory devices having charge-storing nanodots.

BACKGROUND

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

More recently, nanostructure-based charge storage regions have been used to form the charge storage element such as a floating gate in non-volatile memory devices. Metal, semiconductor and dielectric based nanostructures may be used for charge storage. Nanostructures are capable of very small feature sizes, making them attractive as device dimensions continue to scale. Existing fabrication techniques, however, may not be sufficient to fabricate integrated devices with nanostructure-based charge storage regions.

SUMMARY

Embodiments include a method of fabricating a memory device that includes forming a tunnel oxide layer over a memory cell area of a semiconductor substrate, forming a floating gate layer over the tunnel oxide layer in the memory cell area, the floating gate layer comprising a plurality of nanodots embedded in a dielectric material, forming a blocking dielectric layer over the floating gate layer in the memory cell area, removing portions of the blocking dielectric layer, the floating gate layer, the tunnel oxide layer, and the semiconductor substrate in the memory cell area to form a first plurality of isolation trenches, and forming isolation material within the first plurality of isolation trenches.

Further embodiments include a memory device that includes a semiconductor channel between first and second isolation trenches, a tunnel dielectric layer located over the semiconductor channel, a memory cell stack comprising a floating gate layer comprising a plurality of electrically conductive nanodots located over the tunnel dielectric layer and a blocking dielectric layer located over the floating gate layer, wherein the memory cell stack comprises first and second substantially planar etched sidewalls on first and second opposing sides of the stack facing the first and second isolation trenches such that the edges of the floating gate layer and the blocking dielectric layer are aligned on the first and second sides of the stack, and a control gate located over the memory cell stack.

Further embodiments include a memory device that includes a semiconductor substrate having a memory cell area and a peripheral transistor area, a first plurality of isolation trenches in the memory cell area, the first plurality of isolation trenches filled with a first dielectric material, a second plurality of isolation trenches in the peripheral transistor area, the second plurality of isolation trenches filled with a second dielectric material different from the first dielectric material, and a plurality of peripheral transistors located in the peripheral transistor area between the second plurality of isolation trenches.

Further embodiments include a memory device that includes a semiconductor substrate having a semiconductor channel, a tunnel dielectric layer over the semiconductor channel, a plurality of memory elements over the tunnel dielectric layer, wherein each memory element comprises a floating gate layer comprising a plurality of electrically conductive nanodots located over the tunnel dielectric layer, a blocking dielectric layer located over the floating gate layer, and a charge trap layer over the blocking dielectric layer, wherein the control gates in the memory elements are separated from one another by a first spacing ($S_{WL}$) between the control gates in the adjacent memory elements, and a first select gate transistor over the tunnel dielectric layer and having second spacing ($S_O$) between a select gate of the first select gate transistor and a control gate of the memory element adjacent to the first select gate transistor, wherein $S_{WL} < S_O < 2*S_{WL}$.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

FIG. 1 is a top view of a NAND string.

FIG. 2 is an equivalent circuit diagram of the NAND string depicted in FIG. 1.

FIG. 4 is an orthogonal cross-section view taken along line A-A of the portion of the flash memory array depicted in FIG. 3.

FIG. 5 is a three-dimensional drawing of a pair of four word line long portions of two NAND strings.

FIG. 6 is a cross-section view of a device structure illustrating a portion of a memory device fabrication process according to one embodiment.

FIG. 7 is a cross-section view of the device structure illustrating a further portion of the memory device fabrication process according to one embodiment.

FIG. 8 is a cross-section view of the device structure illustrating a further portion of the memory device fabrication process according to one embodiment.

FIG. 9 is a cross-section view of the device structure including peripheral transistor material illustrating a further portion of the memory device fabrication process according to one embodiment.

FIG. 10 is a cross-section view the device structure including peripheral transistor material illustrating a further portion of the memory device fabrication process according to one embodiment.

FIG. 11 is a cross-section view the device structure including a memory element stack formed over a peripheral and memory cell areas illustrating a further portion of the memory device fabrication process according to one embodiment.

FIGS. 16A-C are cross-section views through portions of the device structure, rotated by 90° with respect to FIGS. 6-15, illustrating a further portion of the memory device fabrication process according to one embodiment.

FIGS. 17A-C are cross-section views through portions of the device structure including isolation trenches in the memory cell area illustrating a further portion of the memory device fabrication process according to one embodiment.

FIGS. 18A-C are cross-section views through portions of the device structure illustrating a further portion of the memory device fabrication process according to one embodiment.

FIGS. 19A-C are cross-section views through portions of the device structure illustrating a further portion of the memory device fabrication process according to one embodiment.

FIGS. 20A-C are cross-section views through portions of the device structure including isolation trenches in the peripheral area illustrating a further portion of the memory device fabrication process according to one embodiment.

FIGS. 21A-C are cross-section views through portions of the device structure illustrating a further portion of the memory device fabrication process according to one embodiment.

FIGS. 22A-C are cross-section views through portions of the device structure illustrating a further portion of the memory device fabrication process according to one embodiment.

FIGS. 23A-C are cross-section views through portions of the device structure following planarization illustrating a further portion of the memory device fabrication process according to one embodiment.

FIGS. 24A-E are cross-section views through portions of the device structure illustrating the clearing of a select gate region according to one embodiment.

FIGS. 25A-D are cross-section views through portions of the device structure illustrating a further portion of the memory device fabrication process according to one embodiment.

FIGS. 26A-D are cross-section views through portions of the device structure illustrating the formation of an oxide layer in the select gate region according to one embodiment.

FIG. 27 is a cross-section view through a portion of the device structure illustrating the formation of a spacer layer on the sidewalls of the select gate region according to one embodiment.

FIGS. 28A-D are cross-section views through portions of the device structure illustrating the formation of a select gate material according to one embodiment.

FIGS. 29A-D are cross-section views through portions of the device structure illustrating a further portion of the memory device fabrication process according to one embodiment.

FIGS. 30A-D are cross-section views through portions of the device structure illustrating a further portion of the memory device fabrication process according to one embodiment.

FIGS. 31A-D are cross-section views through portions of the device structure illustrating the formation of a control gate layer according to one embodiment.

DETAILED DESCRIPTION

Figure 3:
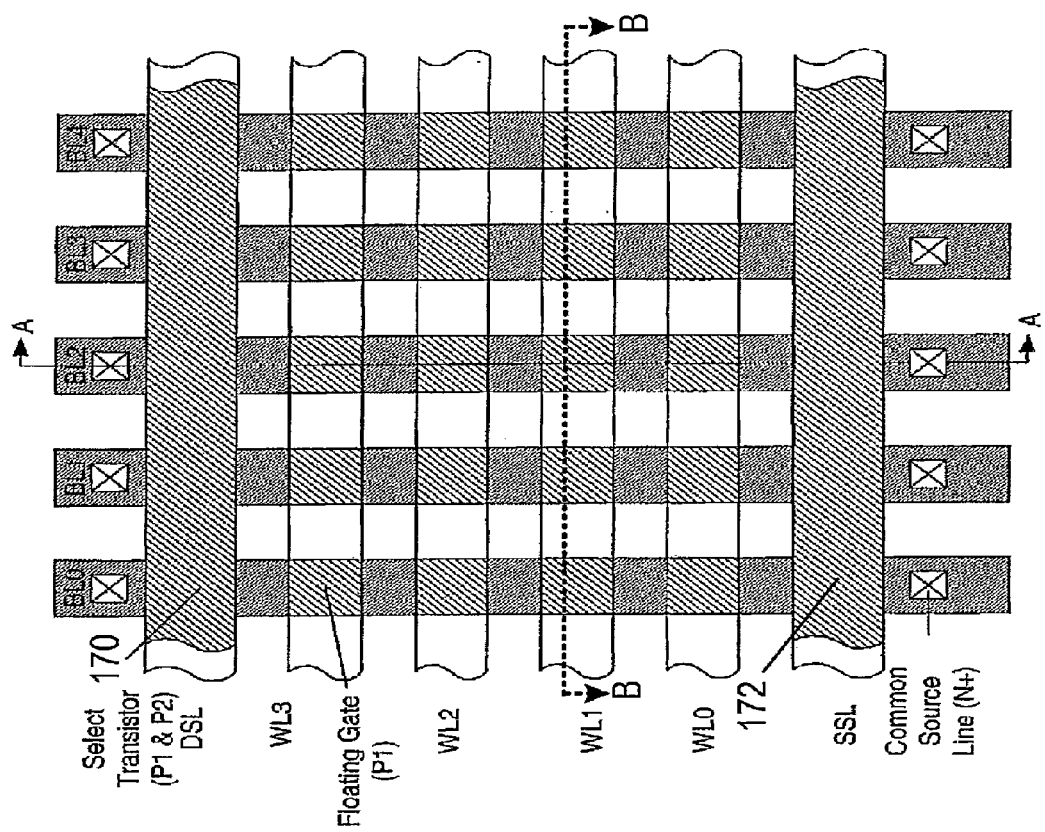
FIG. 3 is a plan view of a portion of a NAND flash memory array.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Various embodiments include non-volatile memory devices having nanostructure-based charge storage regions and fabrication processes for such devices.

In various embodiments, nanostructure-based charge storage regions are included in non-volatile memory devices and integrated with the fabrication of select gates and peripheral circuitry. One or more nanostructure coatings are applied over a substrate at a memory cell area and a peripheral circuitry area. Various processes for removing the nanostructure coating from undesired areas of the substrate, such as target areas for select gates and peripheral transistors, are provided.

Various embodiments include non-volatile memory devices and methods of fabricating such devices in which the individual memory elements comprise "flat cell" memory elements. In a "flat cell" design, discrete memory elements (i.e., cells) are formed as a stack, including a nanostructure-containing charge storage layer or region and a blocking dielectric layer aligned over the charge storage layer or region, where the blocking dielectric does not "wrap-around" the sides of the charge storage layer or region. A control gate is formed over the blocking dielectric and charge storage layers. Exemplary embodiments of nanostructure-containing memory devices having a "flat cell" design and methods of fabricating such devices are disclosed in U.S. Patent Application Publication No. 2011/0020992, published on Jan. 27, 2011, the entire contents of which are incorporated herein by reference.

Embodiments include methods of fabricating a memory device that include forming a tunnel oxide layer over a memory cell area of a semiconductor substrate, forming a floating gate layer over the tunnel oxide layer in the memory cell area, the floating gate layer comprising a plurality of nanodots embedded in a dielectric material, forming a blocking dielectric layer over the floating gate layer in the memory cell area, removing portions of the blocking dielectric layer, the floating gate layer, the tunnel oxide layer, and the semiconductor substrate in the memory cell area to form a first plurality of isolation trenches, and forming isolation material within the first plurality of isolation trenches.

Further embodiments include a memory device that includes a semiconductor channel between first and second isolation trenches, a tunnel dielectric layer located over the semiconductor channel, a memory cell stack comprising a floating gate layer comprising a plurality of electrically conductive nanodots located over the tunnel dielectric layer and a blocking dielectric layer located over the floating gate layer, wherein the memory cell stack comprises first and second substantially planar etched sidewalls on first and second opposing sides of the stack facing the first and second isolation trenches such that the edges of the floating gate layer and the blocking dielectric layer are aligned on the first and second sides of the stack, and a control gate located over the memory cell stack.

Methods and memory devices according various embodiments provide improved alignment of the nanodot-containing floating gate, the blocking dielectric layer and a control gate layer in a "flat cell" memory element configuration. The individual memory elements may be pillar shaped memory elements having a square or rectangular cross-sectional shape in horizontal cross-section parallel to the major surface of substrate. Both the nanodots and the blocking dielectric may be contained within substantially planar sidewalls of the pillar in two mutually perpendicular directions, due to being etched using the same mask and/or during the same step (e.g., before the next layer deposition step). This prevents the nanodots from extending outside the desired floating gate area and trapping charge in undesired regions between adjacent cells.

Further embodiments include a memory device and method of fabricating such a memory device that includes a semiconductor substrate having a memory cell area and a peripheral transistor area, a first plurality of isolation trenches in the memory cell area, the first plurality of isolation trenches filled with a first dielectric material, a second plurality of isolation trenches in the peripheral transistor area, the second plurality of isolation trenches filled with a second dielectric material different from the first dielectric material, and a plurality of peripheral transistors located in the peripheral transistor area between the second plurality of isolation trenches. This allows the larger peripheral area isolation trenches to be filled with a lower stress isolation material than the smaller memory cell area isolation trenches.

Further embodiments include a memory device and method of fabricating such a memory device that includes a semiconductor substrate having a semiconductor channel, a tunnel dielectric layer over the semiconductor channel, a plurality of memory elements over the tunnel dielectric layer, wherein each memory element comprises a floating gate layer comprising a plurality of electrically conductive nanodots located over the tunnel dielectric layer, a blocking dielectric layer located over the floating gate layer, and a charge trap layer over the blocking dielectric layer, wherein the control gates in the memory elements are separated from one another by a first spacing ($S_{WL}$) between the control gates in the adjacent memory elements, and a first select gate transistor over the tunnel dielectric layer and having second spacing ($S_O$) between a select gate of the first select gate transistor and a control gate of the memory element adjacent to the first select gate transistor, wherein $S_{WL}<S_O<2*S_{WL}$. In embodiments, the spacing ($S_O$) between the select gates of the select gate transistors and the control gates of the adjacent memory elements may be optimized to improve performance and yield, such as by lowering device resistance and reducing open space on the wafer.

A portion of a traditional NAND memory array is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. In traditional devices, the floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive material 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by an open area or void 306. Typically, an insulating material or dielectric is formed between adjacent NAND strings in this open area.

Nanostructures are small particles that can be formed with charge-storing capabilities. The small size of nanostructures makes them attractive for forming charge storage regions, such as the floating gates for non-volatile memory cells, as device dimensions continue to be scaled-down. In a storage element, nanostructures can be used to store charge (e.g., electrons). The use of nanostructures as charge-storing particles in memory such as non-volatile memory provides many advantages, including allowing reduced programming voltages, resulting in reduced power/current consumption in the memory device, and scaling to ever smaller dimensions in future generation memory devices.

Nanostructures typically have at least one characteristic dimension that is less than about 500 nm along the smallest axis of the structure. Nanostructures may have characteristic dimensions that are less than 500 nm, for example, less than 10 nm, or even less than 1 nm. In some nanostructures, each of its dimensions may be less than 10 nm, or even 1 nm. By way of non-limiting example, nanostructures include nanowires, nanorods, nanotubes, bridge nanostructures, nanotetrapods, tripods, bipods, and roughly or exactly spherical nanostructures which are referred to as nanodots, but may also be referred to as nanoparticles, quantum dots (nanostructure with quantum confinement) or nanocrystals (having a crystalline structure). Nano structures can be, for example, substantially crystalline, substantially mono-crystalline, polycrystalline, amorphous or a combination thereof.

A nanostructure in one example is comprised of substantially spherical nanostructures or nanodots. Nanostructures can include essentially any material. Charge storing nanostructures may include conductors, non-conductors, and semiconductors. By way of non-limiting example, charge storing nanostructures, such as nanodots, may include materials such as silicon nitride (SiN), silicon (Si), Cobalt (Co), gold (Au), iridium (Ir), iron platinum alloys (FePt), nickel (Ni), palladium (Pd), platinum (Pt), ruthenium (Ru), tantalum (Ta), tantalum nitride (TaN), tellurium (Te), tungsten (W), and the like. Electrically conductive nanostructures with high work functions (e.g., 4 eV or higher, such as 4.5-6 eV), such as Ru, Ta or TaN are preferred to adequately trap and store electrons in the nanostructures without leakage across a tunnel dielectric layer in a nonvolatile memory device. An array of nanostructures may be pre-formed or synthesized prior to incorporation into the memory structure. For example, the nanostructures may include a coating having a ligand associated with a surface of the nanostructure, for example, a silsesquioxane ligand. Nanostructures may also be coated with insulating shells such as oxides or nitrides. In one example, the nanostructures are metal particles which are generally spherical (i.e., nanodots) and have a diameter of about 1 to 30 nm, such as 1-5 nm, for example 1-3 nm. Although, other sizes and shapes can be used as well (e.g., polygonal).

Nanostructure coatings may include one or more nanostructure layers. In one embodiment, the nanostructures are free of solvent in their formation, while in others the nanostructures are dispersed in one or more solvents. The nanostructures may form a disordered or ordered array such as an ordered monolayer or multilayer. A solution of nanostructures can be formed by deposition processes, including spin coating, dip coating, spraying, soaking and other techniques. More information regarding nanostructures and their solutions can be found in U.S. Pat. No. 7,723,186 to Purayath, et al., and U.S. Pat. No. 8,193,055 to Purayath et al., which are both incorporated by reference herein in their entirety.

In one example, polymer micelle technology may be employed to form nanostructures with a high degree of uniformity. Such technology can be used to fabricate self-aligned nanostructures with sizes, e.g., from a few nm to 30 nm (or more). A copolymer solution may be formed, followed by adding salt to provide metal salt ions in a core or micelle, e.g., cavity, of the copolymer, and performing a metal salt reduction to form a metal nanostructure in the core. The polymers may in powdered form, for example, and dissolved in an organic solvent. In other examples, the nanostructures are not dispersed in a solvent.

The copolymer solution with the nanostructures can be deposited onto the substrate. The size and spacing of the nanostructures can be tailored based on the molecular weight of the block copolymer and the amount of the metal salt used. The amount of charge that may be stored by a nanostructure depends on its size, which is a function of the copolymer ratio that has been used to form the micelle. After being deposited, the solution may be partially or entirely removed from the nanostructures, such as by evaporation.

In one embodiment, a coupling or association agent is used to form the nanostructure coating. A coupling layer may be disposed over a dielectric (e.g., oxide) layer. The coupling layer can include a chemical group that interacts with a nanostructure and/or ligand coating of a nanostructure. The coupling layer may be an amino functional silane group. By way of example, coupling layers include thiol, amine, alcohol, phosphonyl, carboxyl, boronyl, fluorine, phosphinyl, alkyl, aryl, etc.

A nanostructure coating may then be applied over the substrate. The nanostructures may be coated with a ligand to interact with the coupling layer. The nanostructures and/or ligands interact with the coupling layer, forming one or more nanostructure layers over the dielectric (e.g., oxide) layer at the active areas of the substrate. The substrate with the nanostructures can be dried, such as by dry nitrogen blowing with no heat. The coupling layer may be removed after forming the nanostructure coating.

The nanostructure coating may be subjected to ultraviolet (UV) curing over all or a portion of the nanostructure coating. Photoresist or another suitable masking material can be applied over select regions of the coating before applying UV light to the substrate surface. After selectively curing the nanostructure layer, a rinse or wash can be applied to the substrate which will remove the nanostructure layer at locations where it has not been cured. Other techniques can be used to remove the nanostructure layer from select region(s).

Photoactivatable compounds may be incorporated into a nanostructure solution. Where a coupling layer is used, the coupling layer material composition may be photoactivatable, such that the bond between the coupling layer and ligand or nanostructure is formed only upon exposure to light. Numerous photoactivatable compounds as known in the art may be used. By way of example, such compounds may include a phenyl azide group, which when photoactivated can from a covalent bond with, e.g., a silsesquioxane ligand comprising a coating associated with a surface of the nanostructures. Other photoactivatable compounds include an aryl azide group (e.g., a phenyl azide, hydroxphenyl azide, or nitrophenyl group), a psoralen, or a diene.

In a storage element, nanodots can be used to store charge (e.g., electrons). The use of nanodots as charge-storing particles in memory such as non-volatile memory provides many advantages, including allowing reduced programming voltages, resulting in reduced power/current consumption in the memory device, and scaling to ever smaller dimensions in future generation memory devices. Further, nanodots are compatible with conventional fabrication techniques and materials.

The integration of nanodot memory cell technology to a full memory device poses a number of design challenges. For example, memory devices include non-floating gate structures such as select gates and peripheral circuitry transistors. As earlier described, the different polysilicon layers P1 and P2 may be shorted together in traditional devices to form a select gate or peripheral transistor. With nanostructures, however, it may be necessary to not include the nanodot layer at the select gate and peripheral transistor areas. This may require the selective formation or removal of nanodots at a memory cell area without formation at areas of the substrate comprising these non-floating gate transistors (e.g., transistors which lack a charge storage region). Such fabrications may be accomplished by removing nanodots from target regions of the substrate for select gate and peripheral transistors.

Further, in a "flat cell" type design, it is preferable that the charge storage nanodots are contained within the discrete memory element "stack," and the presence of charge-storing nanodots outside the discrete flat cell memory elements should be minimized.

FIGS. 6-33 are cross-sectional views depicting the fabrication of a non-volatile memory array in accordance with one embodiment. The described embodiment is exemplary only and should not be taken as limiting the disclosure. The exact materials, dimensions and order of processing may vary according to the requirements of individual implementations. In this example, the integrated formation of storage elements having nanodot charge storage regions with select and peripheral circuitry is disclosed.

Figure 12:
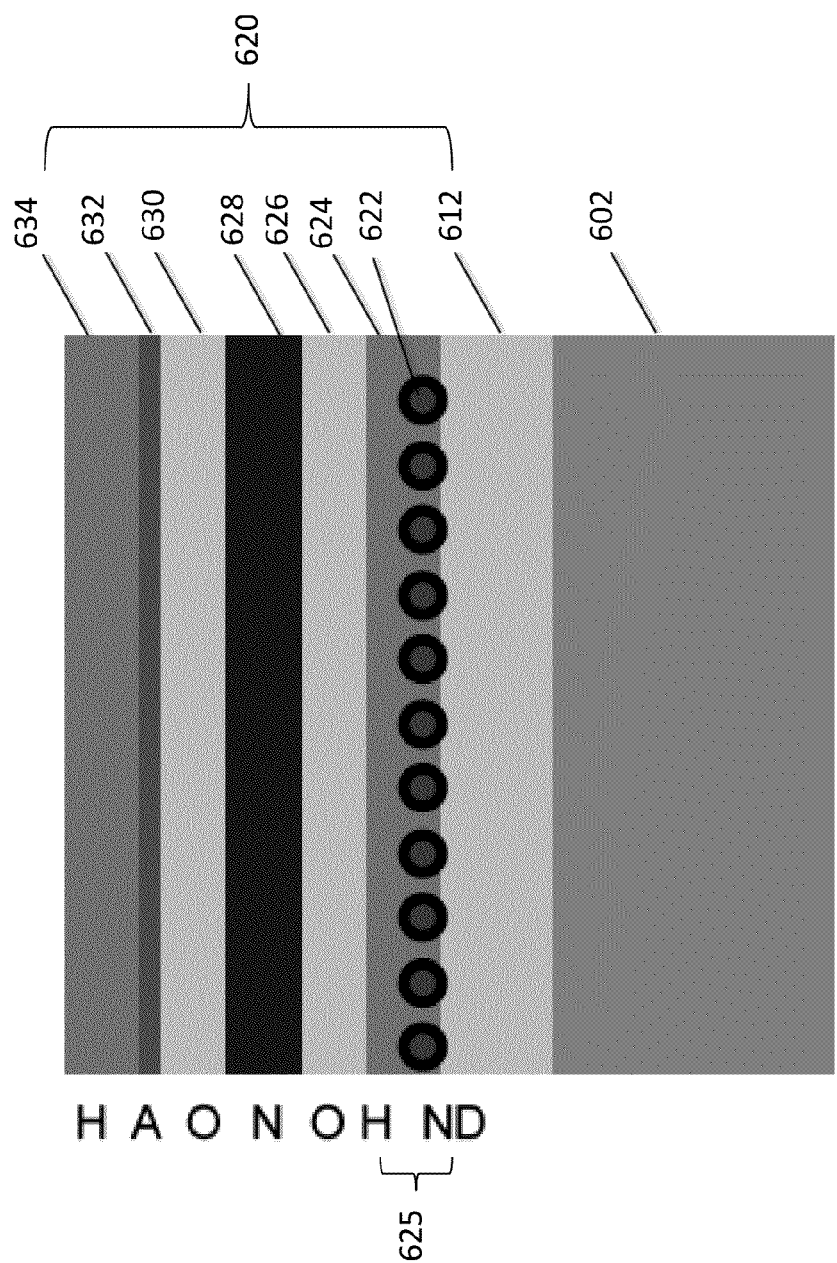
FIG. 12 is a cross-section view a memory element stack including a charge trap layer having a plurality of nanodots.

FIGS. 6-15 illustrate the formation of peripheral transistor material in a peripheral circuitry area of a substrate, the formation of a nanodot-containing memory cell stack over the substrate, including over the active memory cell area and the peripheral circuitry area, and removal of the nanodot-containing memory cell stack from the peripheral circuitry area, according to one embodiment. FIGS. 6-11, 13 and 14 are partial cross-sectional views taken along a line in the bit line or y-axis direction through a portion of a memory array and peripheral circuitry, such as along line A-A depicted in FIG. 3. FIG. 12 is a cross-section view of the nanodot-containing memory cell stack formed in the memory cell area.

FIG. 6 depicts a substrate 602 (e.g., a silicon substrate or wafer or any other semiconductor or semiconductor on insulator (SOI) substrate) having memory array or cell area 604, as well as peripheral circuitry area 606. In this example, peripheral circuitry area 606 includes a low voltage transistor area 608, which is a targeted area for one or more low-voltage peripheral transistors, and a high voltage transistor area 610, which is a targeted area for one or more high-voltage peripheral transistors. The high voltage transistor area 610 of the substrate 602 is recessed relative to the cell area 604 and low voltage transistor area 608. This recess in the substrate 602 may be formed by etching a portion of the surface of the substrate 602 exposed in a resist or other mask opening. One or more wells (e.g., a triple well of p-type and/or n-type ion implanted regions), not shown, are typically formed in the substrate 602 prior to forming a layer stack over the substrate surface. The term substrate may include reference to these well regions.

After implanting and associated annealing of the well(s) to dope the substrate 602, a tunnel dielectric layer 612, such as an oxide (e.g., $SiO_2$) layer, is formed over the substrate 602 at the cell area 604 and the peripheral circuitry area 606, including in the recessed high voltage transistor area 610. The tunnel dielectric layer 612 can be formed in one embodiment by growing a layer of $SiO_2$ by dry or wet oxidation of the silicon substrate 602. A $SiO_2$ CVD or ALD deposition process could alternately be used. The tunnel dielectric layer 612 may be formed with a substantially planar top surface as shown in FIG. 7 (e.g., the layer 612 may be deposited/grown over the substrate 602 and planarized using a suitable technique, such as chemical mechanical polishing (CMP)). The tunnel dielectric layer 612 may have a first thickness (e.g., about 7-8 nm) in the cell area 604 and in the low voltage transistor area 608. Due to the recess in the substrate 602 corresponding to the high voltage transistor area 610, the dielectric layer 612 may have a second, increased thickness (e.g., 25-35, such as about 30 nm) in the high voltage transistor area 610.

As illustrated in FIG. 8, void areas 613, such as grooves, may be formed in the surface of the tunnel dielectric layer 612 at the high voltage transistor area 610, such as by etching of the dielectric layer 612 exposed in a resist or other mask opening. A conductive material layer 614 is formed over the tunnel dielectric layer 612 in the peripheral circuitry area 606, including in the void areas 613 of the high voltage transistor area 610, as shown in FIG. 9. The conductive material layer 614 may comprise a doped semiconductor material, such as doped amorphous or polycrystalline silicon. In preferred embodiments, conductive material layer 614 comprises a heavily-doped (e.g., n+) amorphous silicon material. The conductive material layer 614 may have a thickness of about 30 nm over the low voltage transistor area 608 and the high voltage transistor area 610 (excluding the void areas 615). Where the conductive material layer 614 fills the void areas 613, the thickness of the layer 614 may be greater than about 30 nm, such as between about 50-60 nm. The conductive material layer 614 in the void areas 613 may provide isolation between high voltage transistors in the fabricated device. The conductive material layer 614 is formed over the peripheral circuitry area 606 but not over the memory cell area 604. For example, the conductive material may be formed over the entire substrate 602 (e.g., wafer) by a suitable process. The conductive material may then be cleared from the memory cell area 604, such as by forming a photoresist mask and/or hard mask layer over the peripheral circuitry area 606, followed by etching to remove the conductive material from the cell area 604. The photoresist and/or mask layer may then be removed, leaving layer 614 over the peripheral circuitry area 606. Alternatively, lift-off may be used to remove a portion of layer 614 formed over a lift-off mask located in the cell 604 region. The layer 614 may optionally be planarized using a suitable process, such as by CMP. In various embodiments, the conductive material layer 614 may be formed as an amorphous silicon layer that is later converted to a polysilicon layer by subjecting the material to high-temperature. The material may be subjected to high-temperature in a separate heat-treatment step, or in some embodiments, the material may be subjected to high-temperature during one or more high-temperature processing steps during fabrication of the memory device, as described below, and may be converted to polysilicon during one or more of these processing step(s).

It is noted that a first layer may be said to be over a second layer when one or more intervening layers are located between the first layer and the second layer, as well as when the first and second layers are in direct contact. In one embodiment, the doped silicon conductive material 614 may be formed by plasma enhanced chemical vapor deposition (PECVD), low-pressure chemical vapor deposition (LPCVD), or other suitable processes.

In embodiments, one or more protective or pad layers may be formed over the conductive material layer 614 in the peripheral circuitry area 606. For example, as shown in FIG. 10, a SiN pad layer 616, which may be about 10-20 nm, such as about 15 nm thick, is formed over the conductive material layer 614, and a silicon oxide pad layer 618, which may be about 5-15, such as about 10 nm thick, is formed over the SiN layer 616. Layer 618 may be formed by CVD using a tetraethyl orthosilicate (TEOS) precursor. The SiN and/or silicon oxide layers 616, 618 may be formed over the peripheral circuit area 606 in a similar manner as the formation of conductive material layer 614. For example, in one embodiment, the conductive material layer 614, SiN layer 616 and silicon oxide layer 618 may be formed over the entire substrate 602, and then cleared from the cell area 604, such as by etching, leaving the conductive material layer 614, the SiN layer 616 and/or the silicon oxide layer 618 over the peripheral circuitry area 606 but not the cell area 604. In other embodiments, the layers may be formed in sequence via separate processing steps. For example, the conductive material layer 614 may be formed over the peripheral circuitry area 606 but not the cell area 604, as described above. The SiN layer 616 and/or the silicon oxide layer 616 may then be formed over the over entire substrate 602 and cleared from the cell area 604, such as by etching, leaving the conductive material layer 614, the SiN layer 616 and/or the silicon oxide layer 618 over the peripheral circuitry area 606 but not the cell area 604.

Memory cell stack layers 620 may then be formed over the entire substrate 602 (i.e., wafer), including the cell area 604 and peripheral circuitry area 606, as shown in FIG. 11. The memory cell stack layers 620 include at least one layer of nanostructures (e.g., nanodots) over the tunnel dielectric layer 612 in the memory cell area 604, and over the pad layers 616, 618 in the peripheral area 606. The memory cell stack layers 620 further include at least one blocking dielectric layer over the nanostructure layer, as will be discussed in more detail below.

FIG. 12 illustrates the structure of the memory cell stack 620 according to one embodiment. FIG. 12 depicts the memory cell stack 620 formed over the tunnel dielectric layer 612 and substrate 602 in the memory cell area 604. In one embodiment for forming the memory cell stack 620, an optional coupling agent, such as any suitable organic material which makes the oxide surface hydrophobic (e.g., hexamethyldisilazane (HDMS), etc.) may be provided over the oxide surface layer 612. The oxide surface layer may then be coated with nanodots 622, for example, by spin coating the nanodots 622, which may be coated with ligand(s) and be in a solution, such as a polymer solution, onto the oxide surface layer 612 (e.g., tunnel oxide). The nanodots 622 may be UV cured to adhere the nanodots 622 to the oxide surface layer 612. Optionally, the nanodots 622 may be surface nitrided (such as via plasma nitridation and/or deposition of a SiN barrier layer), as is described U.S. Provisional Application No. 61/667,007, entitled "NAND Memory Device Containing Nanodots," filed on Jul. 2, 2012, the entire contents of which are incorporated herein by reference.

One or more additional coatings of nanodots and ligands may be coated on the oxide surface layer to increase the density of nanodots in the nanodot layer, filling in gaps left from the first coating, as described in U.S. Provisional Application No. 61/667,007, which has been incorporated by reference. Any additional coatings may also be applied via spin coating and UV cured to adhere the additional nanodots to the oxide surface layer.

Following nanodot 622 deposition, a cure and/or rapid thermal processing step may be performed to volatize hydrocarbons and provide densification of the nanodot layer. A high-k dielectric material 624 is then deposited over the nanodots 622 such that the nanodots 622 are embedded within the dielectric material 624 to form a floating gate layer 625 (i.e., a charge trap layer). In various embodiments, the floating gate layer 625 may include a high dielectric constant (high-k) material such as aluminum oxide ($Al_2O_3$), hafnium oxide ($HfO_2$), silicon nitride, zirconium oxide ($ZrO_2$) or combinations of these materials. Other high-k materials may be used as well. High-k materials have a relatively high dielectric constant compared to the dielectric constant of $SiO_2$. However, $SiO_2$ or other oxide for the floating gate layer is also possible. In a preferred embodiment, the high-k dielectric material 624 of the floating gate layer 625 comprises hafnium oxide ($HfO_2$).

In some embodiments, the floating gate layer 625 may provide a floating gate sublayer, such as described and illustrated in U.S. Pat. Nos. 7,723,186 and 8,193,055, which are incorporated by reference herein. One or more additional nanodot-containing floating gate sublayers may be formed over the first nanodot/high-k floating gate sublayer 625 in the manner described above. Optionally, a continuous metal charge trap layer may be formed over the nanodot-containing floating gate layer 625, as described in U.S. Provisional Application No. 61/667,007, which has been incorporated by reference.

A blocking dielectric may then be formed over the nanodot-containing floating gate layer 625. As shown in FIG. 12, the blocking dielectric (i.e., inter-gate dielectric) may comprise a plurality of layers, including oxide-nitride-oxide (ONO) layers 626, 628, 630, an aluminum oxide ($Al_2O_3$) layer 632, and a hafnium oxide ($HfO_2$) layer 634. In some embodiments, the blocking dielectric may include all high-k dielectric materials, such as $Al_2O_3/HfO_2$ instead of an ONO/$Al_2O_3/HfO_2$ stack.

Although FIG. 12 illustrates the memory cell stack layers 620 being formed over the tunnel oxide layer 612 in the memory cell area 604, it will be understood that that the same or similar processes as described above may be used to coat the memory cell stack layers 620 over the entire substrate 602, including over the pad layers 616, 618 in the peripheral circuitry area 606.

Figure 13:
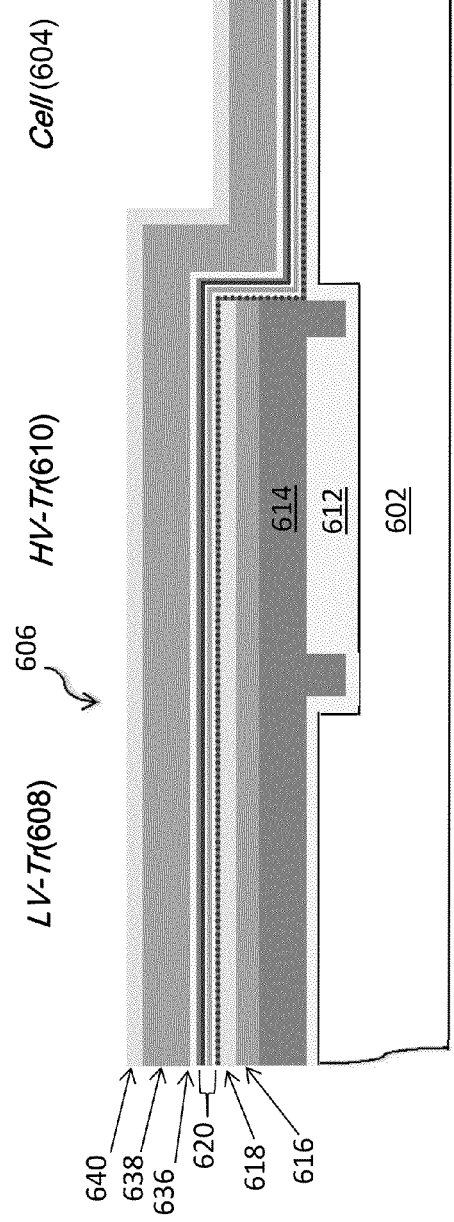
FIG. 13 is a cross-section view of the device structure illustrating a further portion of the memory device fabrication process according to one embodiment.

A thin (e.g., ~4 nm) cover oxide layer 636, which may be $SiO_2$, is then formed over the memory cell stack layers 620, as shown in FIG. 13. A pad dielectric layer 638 (e.g., 20-40 nm, such as about 30 nm SiN) is then deposited over the cover oxide layer 636, and an additional pad layer 640 (e.g., 5-15 nm, such as about 10 nm silicon oxide) is formed over pad layer 636, such as by CVD using a TEOS source.

Figure 14:
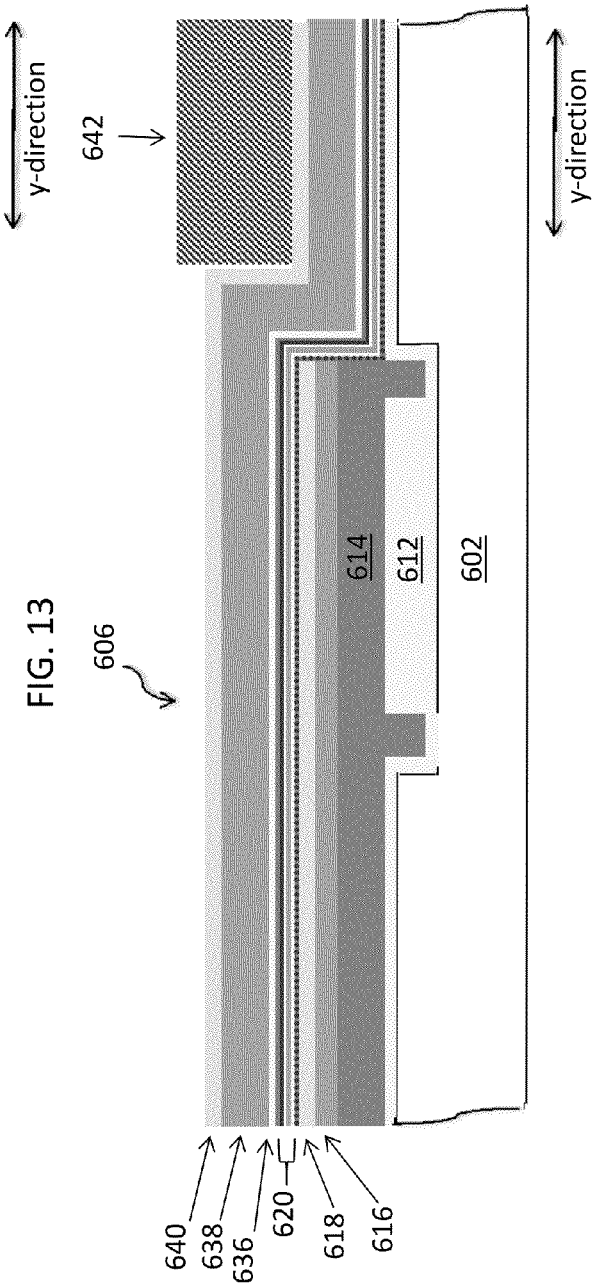
FIG. 14 a cross-section view of the device structure illustrating a further portion of the memory device fabrication process according to one embodiment.
Figure 15:
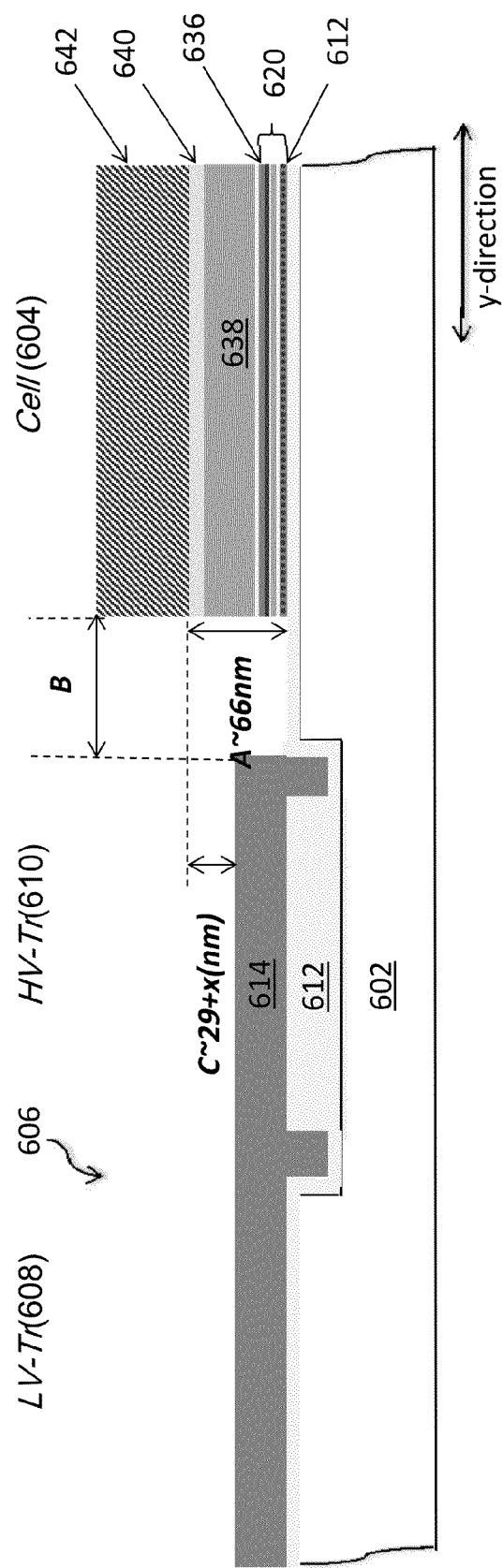
FIG. 15 is a cross-section view of the device structure with the memory device stack removed from the peripheral area illustrating a further portion of the memory device fabrication process according to one embodiment.

The memory cell stack layers 620, including the nanodots and the blocking dielectric material, are then removed from the peripheral circuitry area 606 while remaining in the memory cell area 604. In one embodiment, the memory cell area 606 is covered by a mask layer 642, which may be photoresist and/or one or more hard mask layers, as shown in FIG. 14, followed by etching as shown in FIG. 15. The mask layer 642 may be formed to define a gap (B in FIG. 15) on the periphery of the cell area 604, adjacent to the peripheral circuitry area 606 (i.e., between areas 604, 606) so that any material on the sidewalls of the peripheral circuitry area 606 is removed during the etching step. The gap, B, may have a width that is equal to or greater than the thickness of the layers forming the sidewall, i.e., the memory cell stack layers 620, the cover oxide layer 636, the pad layer 638, and the pad layer 640, which in embodiments may be about 59 nm. The width of the gap B may further account for the overlay variation in the photolithographic tool(s) used to pattern and form the mask layer 642. The worst case overlay variation may be between about 4-7 nm, depending on the tool(s) utilized, and thus in some embodiments, the width of the gap B may be at least about 66 nm, such as 70-100 nm, to ensure that the sidewall areas are cleared down to the tunnel oxide layer 612, as shown in FIG. 15.

In the peripheral circuitry area 606, etching removes the silicon oxide pad layer 640, the SiN pad layer 638, the cover oxide layer 636, the memory cell stack layers 620, the silicon oxide pad layer 618 and the SiN pad layer 616, leaving the conductive material layer 614 exposed. Following etching, the mask layer 642 may be removed from the memory cell area 604.

FIGS. 16A-23C are partial cross-sectional views taken along a line in the word line or x-axis direction through portions of the memory cell area 604, low voltage transistor area 608, and high-voltage transistor area 610, such as along line B-B depicted in FIG. 3. The views shown in FIG. 16A-23C are rotated 90° with respect to the views shown FIGS. 6-15. In this x-axis orientation, the low voltage transistor area 608 is located adjacent the memory cell area 604, as opposed to in the y-axis orientation, where the high voltage transistor area 610 is located adjacent to the memory cell area 604.

FIGS. 16A-23B illustrate the formation of isolation trenches in both the memory cell area 604 and in the peripheral circuitry area 606. In one embodiment, the isolation trenches are elongated in a first direction (i.e., along the bit line or y-axis direction) and are spaced along a second direction (i.e., along the word line or x-axis direction), defining active regions (i.e., rails) between the isolation trenches.

In one embodiment, isolation trenches are initially formed in the cell area 604. The cell area 604, low voltage transistor area 608 and high voltage transistor area 610 may be covered by a mask layer 646, which may be a hard mask layer, as shown in FIGS. 16A-C, and/or a resist layer. In the low voltage transistor area 608 and the high voltage transistor area 610, a pad layer 644, such as a silicon oxide layer, may be formed by CVD using a TEOS source over the conductive material layer 614 prior to forming the mask layer 646. In the cell area 604, conventional photolithography may be used to pattern the hard mask layer 646 into strips elongated in the direction of the y-axis with spaces between strips in the direction of the x-axis, as shown in FIG. 16A. Spacer-assisted patterning, nano-imprint patterning, and other patterning techniques can also be used to form strips of the hard mask layer 646 at reduced features sizes. The pattern, repetitive in the x-axis direction, defines a first direction of etching to form columns of the targeted memory array.

Using the patterned hard mask layer 646 at the memory cell area 604, the silicon oxide pad layer 640, the SiN pad layer 638, the cover oxide layer 636, the memory cell stack layers 620, the tunnel oxide layer 612 and substrate 602 are etched to define a plurality of shallow isolation trenches 648 that divide the substrate into isolated active areas between the trenches 648, as shown in FIG. 17A. The mask layer 646 is then removed. Etching through the memory cell stack layers 620 (i.e., through the nanodot-containing floating gate layer 625 and blocking dielectric layer(s) as shown in FIG. 12) produces etched sidewalls 649 in the stack 620 that extend in the bit line or y-axis direction. This helps maintain the alignment of the nanodots with the blocking dielectric in a "flat cell" memory element configuration, since neither the nanodots nor the blocking dielectric may extend in the word line or x-axis direction beyond the etched sidewalls 649. A thin oxide layer 650 may be formed over the surface of the isolation trenches 648, such as by atomic layer deposition of $SiO_2$, to protect the exposed edges of the memory cell stack 620.

The isolation trenches 648 may be gap-filled by depositing (e.g., spin coating) an isolation material 652, such as silicon oxide formed from a polysilazane (PSZ) precursor or another flowable trench fill material, such as spin-on glass, as shown in FIGS. 18A-18C. After the PSZ is annealed to convert it to silicon oxide in an oxygen or water vapor ambient, chemical mechanical polishing (CMP) or etch back processes may be used to create a substantially planar upper surface of the layer stacks and remove the trench isolation material 652 and oxide layer 650 from the low and high voltage transistor areas 608, 610, as shown in FIGS. 19B and 19C.

Next, isolation trenches are formed in the peripheral circuitry area. The cell area 604, low voltage transistor area 608 and high voltage transistor area 610 may be covered by another mask layer 654, which may be a hard mask layer, as shown in FIGS. 19A-C. In the low voltage transistor area 608 and the high voltage transistor area 610, conventional photolithography may be used to pattern the hard mask layer 654 to form open (i.e., unmasked) regions elongated in the direction of the y-axis, as shown in FIGS. 19B and 19C. Spacer-assisted patterning, nano-imprint patterning, and other patterning techniques can also be used. Using the patterned hard mask layer 654, the pad layer 644, the conductive material layer 614, the tunnel oxide layer 612 and substrate 602 are etched to define a shallow isolation trenches 656 in the low voltage transistor area 608 (see FIG. 20B) and the high voltage transistor area 610 (see FIG. 20C). A thin oxide layer 658 may be formed over the surface of the isolation trenches 656.

After mask layer 654 is removed, the isolation trenches 656 may be gap-filled by depositing an isolation material 660, which is preferably a lower stress material than the isolation material 652. Material 660 may be a non-doped silicate glass (e.g., NSG) or other low stress spin-on glass or $SiO_2$, as shown in FIGS. 21A-C. Growth processes may also be used. Chemical mechanical polishing (CMP) or etch back processes may be used to create a substantially planar upper surface of the layer stacks and remove the trench isolation material 660 from the cell area 604 and above oxide polish stop layer 658 in the peripheral area 606 to leave trench fill isolation 660 in trenches 656, as shown in FIGS. 22A-C. Further planaraziation (e.g., CMP), stopping on the conductive material layer 614 in the peripheral circuitry area 606 and the SiN pad layer 638 in the cell area 604, may be used to provide the device as shown in FIGS. 23A-C. At this stage of the fabrication process, there is no topology on the wafer.

FIGS. 24A-30D illustrate the formation of select gate regions in the memory cell area 604. FIGS. 24A-C, 25A-C, 26A-C, 28A-C, 29A-C, 30A-C and 31A-C are cross-section views of the cell area 604, low voltage transistor area 608 and high-voltage area 610 after isolation trench formation and planarization as described above, viewed along the word line or x-axis direction. FIGS. 24D, 24E, 25D, 26D, 27, 28D, 29D, 30D and 31D are partial cross-sections of the memory cell area 604 taken along line C-C of FIG. 24A and viewed along the bit line or y-axis direction (i.e., rotated 90° with respect to FIG. 24A). As shown in FIGS. 24A-C, the cell area 604, low voltage transistor area 608 and high voltage transistor area 610 may be covered by a mask layer 662 (e.g., photoresist or hard mask layer). In the memory cell area 604, the mask layer 662 may be patterned (e.g., via conventional photolithography, spacer-assisted patterning, nano-imprint patterning, etc.) to provide an open (i.e., unmasked) region having a width, $S_{SG}$, as shown in FIG. 24D. The width $S_{SG}$ of this open region defines a select gate area 664. The width of the select gate region 664 may be selected to correspond to the width of one or more select gates (i.e., transistors) to be formed in the region 664, as well as any spacing between select gates. In one embodiment, two select gates are formed in region 664, and $S_{SG}$ corresponds to the width of the two select gates and the spacing between the gates. The $S_{SG}$ width may also vary depending on whether the select gates to be formed in region 664 are source-side gates, drain-side gates or both.

In FIG. 24E, the SiN pad layer 638, cover oxide layer 636, memory cell stack 620 and tunnel oxide layer 612 are removed from the select gate area 664 by etching. The mask layer 662 may then be removed (e.g., via ashing), as shown in FIGS. 25A-D. The tunnel oxide layer, which was removed from the select gate area 664 during the etch, is then re-formed in the select gate area 664. In one embodiment, the oxide layer may be re-formed by depositing an oxide material (e.g., $SiO_2$) over the surfaces of the select gate area 664 via atomic layer deposition (ALD), as shown in FIG. 26D. Coating the oxide layer using an ALD process will not damage the exposed nanodot layer within the memory cell stack 620. The deposited material may then be densified (e.g., at ~500° C.) to form the tunnel oxide layer 668 within the select gate area 664.

In an alternative embodiment shown in FIG. 27, a spacer 666 may be formed over the sidewalls of the select gate area 664 to protect the nanodots within the memory cell stack 620. The spacer 666 may be a nitride material that has a thickness between 2-3 nm. The spacer 666 may be formed by nitride deposition and etchback to provide the thin sidewall spacer. With the sidewalls protected by nitride spacers 666, the tunnel oxide layer 668 may then be formed within the select gate area 664 using various techniques without damaging the nanodots.

After the tunnel oxide layer 668 is formed in the select gate area 664, a select gate material 670 is formed over the tunnel oxide layer 668 in the select gate area 664, as shown in FIGS. 28A-D. The select gate material 670 may be a layer of polysilicon that is deposited over the memory cell area 604, the low voltage transistor area 608 and the high voltage transistor area 610, as shown in FIGS. 28A-C.

A planarization step (e.g., CMP, etching, etc.) removes the select gate material 670 from the low voltage and high voltage transistor areas 608, 610 (see FIGS. 29B and 29C) and from the surface of the memory cell area 604 (see FIG. 29A), leaving the select gate material 670 in the select gate area, as shown in FIG. 29D. The remaining SiN layer 638 may be removed (e.g., stripped) from the cell area 604, and the cover oxide layer 636 may be removed (e.g., etched) to expose the blocking dielectric of the memory cell stack 620, as shown in FIGS. 30A and 30D. The isolation trench fill material 652 extends above the surface of the blocking dielectric of the memory cell stack 620, as shown in FIG. 30A. The select gate material 670 also extends above the surface of the blocking dielectric of the memory cell stack 620, as shown in FIG. 30D.

FIGS. 31A-D illustrate the formation of a control gate layer over the memory cell area 604, the low voltage transistor area 608 and the high voltage transistor area 610 according to one embodiment. As shown in FIGS. 31A and 31D, a gate conductor layer 672, which may be a metal, such as tungsten, or another conductive material such as tungsten nitride (WN) or a heavily-doped semiconductor material (e.g., polysilicon), is formed the memory cell area 604. The gate conductor layer 672 is in direct electrical contact with the surface of the blocking dielectric of memory cell stack 620, as shown in FIG. 31A, and is also in direct contact with the select gate material (e.g., polysilicon) layer 670, as shown in FIG. 31D. A barrier metal layer (not shown) may be formed between the blocking dielectric of the memory cell stack 620 and the gate conductor layer 672. The barrier metal layer may be, for example, TiSiN or TaN, which may be formed by ALD over the blocking dielectric of the memory cell stack 620, and the gate conductor layer 672 may be formed over the barrier metal layer. The gate conductor layer 672 is also formed in contact with the conductive material layer 614 in the low voltage and high voltage transistor areas 608, 610. In embodiments, the conductive material layer 614 may be converted to polysilicon by this stage of the fabrication process.

Figure 32:
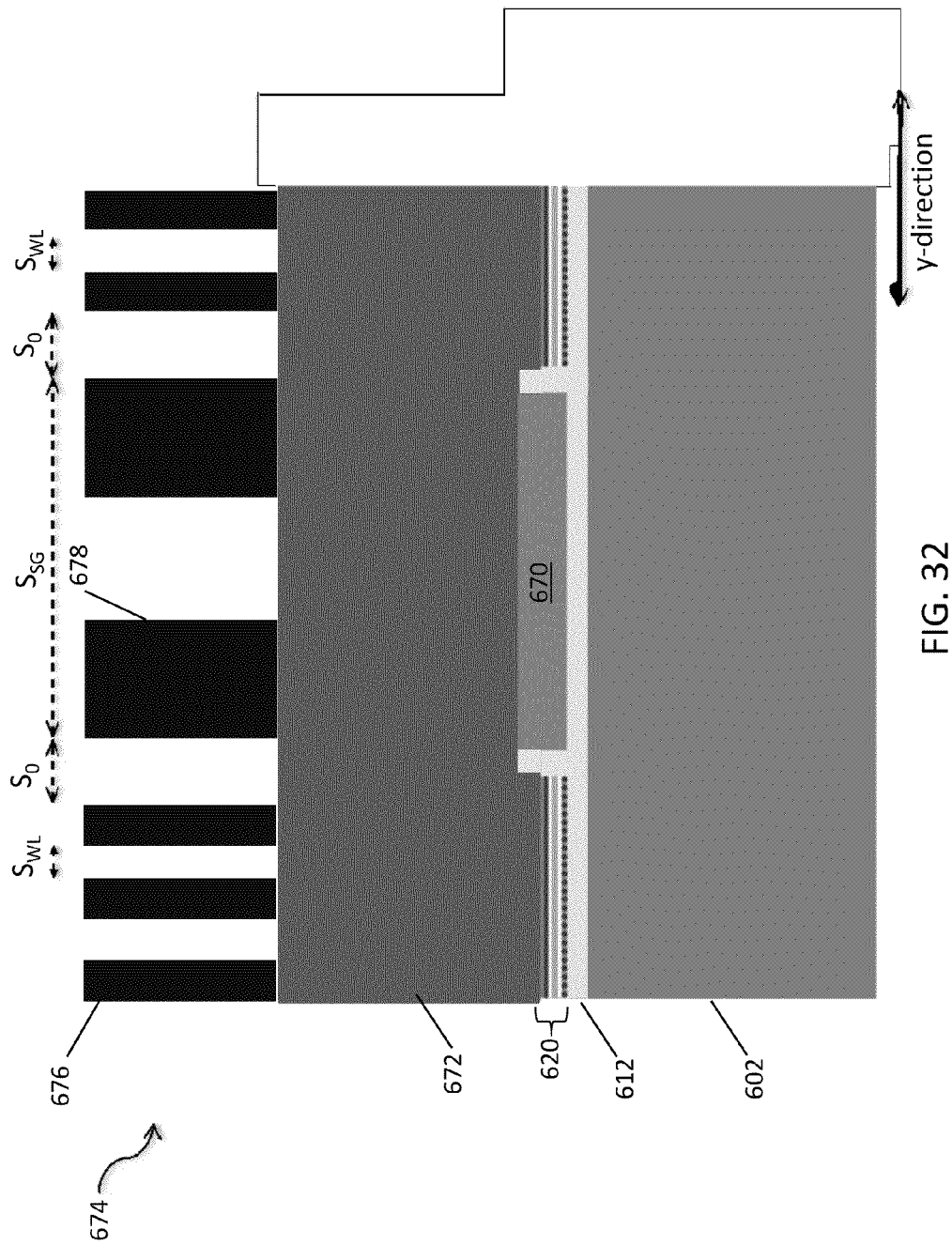
FIG. 32 is a cross-section view through a portion of the device structure illustrating the formation of a patterned mask defining memory elements and select gate transistors according to one embodiment.
Figure 33:
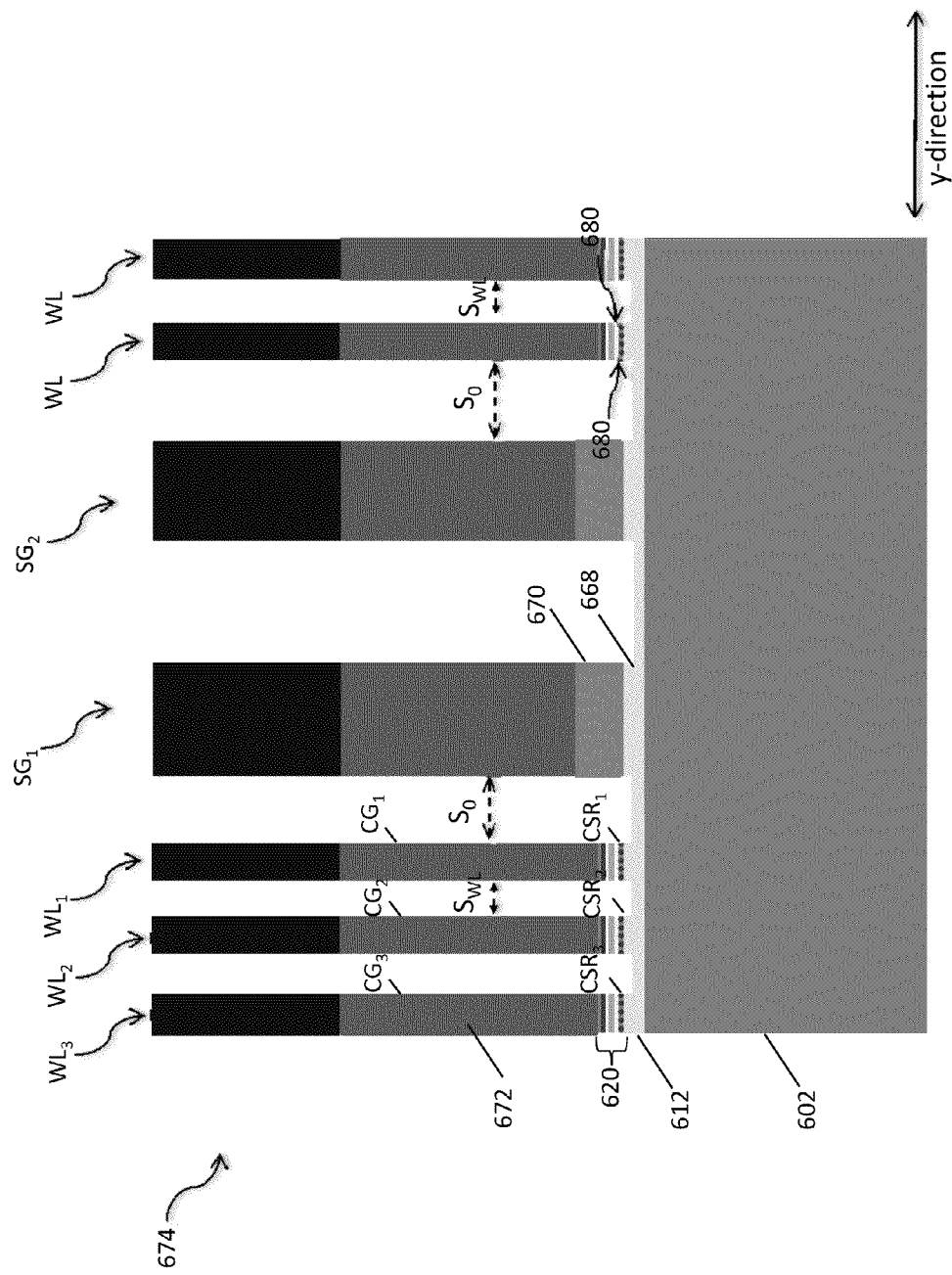
FIG. 33 is a cross-section view through a portion of the device structure following an etching step to form memory elements and select gate transistors according to one embodiment.

FIGS. 32 and 33 illustrate the formation of individual memory cells and select gates in the memory cell area 604. A mask layer 674, which may be a hard mask layer, is formed over the gate conductor layer 672, as shown in FIG. 32. Conventional photolithography may be used to pattern the hard mask layer 674 into strips 676, 678 elongated in the direction of the x-axis with spaces between strips adjacent in the direction of the y-axis. Spacer-assisted patterning, nano-imprint patterning, and other patterning techniques can also be used to form strips 676, 678 of the hard mask layer 674 at reduced features sizes. The pattern, repetitive in the y-axis direction, defines a first direction of etching to form columns of the targeted memory array.

Strips 678 define select gates and are aligned over the select gate area 664 with a total width of $S_{SG}$ (i.e., the width of the two select gates and the spacing between the gates) (see FIGS. 32 and 24D-E). Strips 676 define word lines in the conductive gate layer and individual memory cells in the memory cell stack 620. Strips 676 may be regularly spaced with a word line spacing, $S_{WL}$, between adjacent strips 676. $S_{WL}$ may be about 19 nm in certain embodiments. A memory string may comprise a plurality of memory cells and associated word lines spaced along the bit line or y-axis direction between a pair of select gate transistors. Typically, a string will include, for example, 4, 8, 32, 64 or more memory cells between select gate transistors. Optionally, the word lines and memory cells immediately adjacent to the select gates may be non-active or "dummy" lines, so that, for example, a string of 64 active memory cells may include 66 total cells (i.e., 64 active and 2 dummy cells) between the select gates.

Due to focusing issues (i.e., overlay), the space $S_0$ between the select gate and the word line/memory cell (e.g., dummy gate/dummy cell) adjacent to the select gate typically cannot be made the same as the word line spacing, $S_{WL}$. In some cases, the $S_0$ spacing may be made larger than $S_{WL}$, for example equal to twice the word line spacing, $S_{WL}$, such that $S_0$ is about 40 nm. However, this creates a large open space on the wafer, and may also lead to a high resistance problem for the select gates, both of which are undesirable. In embodiments, these problems may be avoided by utilizing an $S_0$ that is approximately equal to the word line spacing, $S_{WL}$, plus the system overlay variation (OL). Thus, for example, for a memory device with a word line spacing $S_{WL}$ of 19 nm and a worst case overlay variation (OL) between about 4-7 nm (depending on the tool(s) utilized), the $S_0$ spacing may be 23-30 nm, such as about 25 nm. In general, the $S_0$ spacing may be greater than the word line spacing, $S_{WL}$, and less than twice the word line spacing, $2*S_{WL}$, such as less than or equal to about $1.5*S_{WL}$, for example $(1.25$ to $1.95)*S_{WL}$, e.g., $(1.25$ to $1.5)*S_{WL}$.

The device may be etched using the mask through the gate conductor layer 672 and memory cell stack layers 620, stopping on the tunnel oxide layer 612, as shown in FIG. 33. Etching through the memory cell stack layers 620 (i.e., through the nanodot-containing floating gate layer 625 and one or more blocking dielectric layer(s) 624-634 as shown in FIG. 12) produces etched sidewalls 680 in the stack 620 that extend in the word line or x-axis direction. In conjunction with the etched sidewalls 649 in the bit line or y-axis direction formed during the isolation trench etch (see FIG. 17), this helps maintain the alignment of the nanodots with the blocking dielectric in a "flat cell" memory element configuration (e.g., a pillar shaped memory element in a square or rectangular cross-sectional shape in horizontal cross-section parallel to the major surface of substrate 602), comprising a plurality of discrete nanodot-containing charge storage regions (i.e., $CSR_1$, $CSR_2$, $CSR_3$, etc.). Preferably, neither the nanodots nor the blocking dielectric extend beyond the etched sidewalls 649, 680 of the pillars in either the y-axis or x-axis directions. Etching of the gate conductor layer 672 produces a plurality of control gates (i.e., $CG_1$, $CG_2$, $CG_3$, etc.) in alignment with the blocking dielectric of each memory cell. The control gates contact the blocking dielectric and are capacitively coupled to the nanodot-containing charge storage regions. The control gates may extend in the x-axis direction (i.e., into and out of the page in FIG. 33) to form word lines (i.e., $WL_1$, $WL_2$, $WL_3$, etc.) of a memory element array (see, e.g., FIG. 5).

In the select gate area, the device may be etched through the gate conductor layer 672 and the select gate material 670 to the select gate tunnel oxide layer 668 to produce one or more select gate transistors, $SG_1$, $SG_2$, each comprising a gate conductor layer 672 shorted to a select gate material layer 670. The select gate material 670 (e.g., polysilicon) may be etched during high-k etch using a chlorine based chemistry, e.g., a $BCl_3/Cl_2$ chemistry. For example, layers 624, 626, 628, 630, 632 and 634 (see FIG. 12) and the select gate material 670 can be etched in the same step using the chlorine based gas chemistry, followed by an additional polysilicon etch step to clear any polysilicon stringers from layer 670. Then, layer 622 may be etched to remove nanodots, which may be Ru nanodots in embodiments.

Various backend processes can be performed to finalize fabrication of the memory array. For example, a passivation dielectric layer can be deposited, followed by forming metal conductive lines and vias to connect the lines with source and drain regions at the end of the memory cell strings, etc.

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. A memory device, comprising:
   a semiconductor channel;
   a tunnel dielectric layer over the semiconductor channel;
   a plurality of memory elements over the tunnel dielectric layer, wherein each memory element comprises a floating gate layer comprising a plurality of electrically conductive nanodots located over the tunnel dielectric layer, a blocking dielectric layer located over the floating gate layer, and a charge trap layer over the blocking dielectric layer, wherein the control gates in the memory elements are separated from one another by a first spacing ($S_{WL}$) between the control gates in the adjacent memory elements;
   a first select gate transistor over the tunnel dielectric layer and having second spacing ($S_0$) between a select gate of the first select gate transistor and a control gate of the memory element adjacent to the first select gate transistor, wherein $S_{WL} < S_0 < 2*S_{WL}$.

2. The device of claim 1, wherein $S_0 < 1.5*S_{WL}$.

3. The device of claim 1, wherein $S_{WL}$ is approximately 20 nm or less, and $S_0$ is less than 30 nm.

4. The device of claim 3, wherein $S_0$ is between about 23-25 nm.

5. The device of claim 1, further comprising:
   a second select gate transistor over the tunnel dielectric layer and having second spacing ($S_0$) between a select gate of the second select gate transistor and a control gate of the memory element adjacent to the second select gate transistor, wherein $S_{WL} < S_0 < 2*S_{WL}$.

6. The device of claim 5, wherein the plurality of memory elements are located between the first select gate transistor and the second select gate transistor.

7. The device of claim 6, wherein the plurality of memory elements comprise a string of at least sixty-four memory elements and two dummy memory elements located between the first select gate transistor and the second select gate transistor, and a first dummy memory element is adjacent to the first select gate transistor and the second dummy memory element is adjacent to the second memory gate transistor.

* * * * *